(12) United States Patent
Jung et al.

(10) Patent No.: US 12,178,091 B2
(45) Date of Patent: Dec. 24, 2024

(54) DISPLAY APPARATUS

(71) Applicant: Samsung Display Co., Ltd., Yongin-Si (KR)

(72) Inventors: Kwangchul Jung, Yongin-si (KR); Mina Kim, Yongin-si (KR); Seulbee Lee, Yongin-si (KR); Yongjun Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 428 days.

(21) Appl. No.: 17/551,754

(22) Filed: Dec. 15, 2021

(65) Prior Publication Data

US 2022/0199747 A1  Jun. 23, 2022

(30) Foreign Application Priority Data

Dec. 17, 2020 (KR) .................. 10-2020-0177817

(51) Int. Cl.
*H10K 59/131* (2023.01)
*H10K 59/12* (2023.01)
*H10K 59/121* (2023.01)
*H10K 59/123* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............ H10K 59/131; H10K 59/1213; H10K 59/1216; H10K 59/123; H10K 59/12; H10K 59/121; G09G 3/3233; G09G 3/3225

See application file for complete search history.

(56) References Cited

U.S. PATENT DOCUMENTS

| | | | |
|---|---|---|---|
| 9,165,993 | B2 | 10/2015 | Kim |
| 10,665,657 | B2 | 5/2020 | Kang et al. |
| 2016/0210896 | A1* | 7/2016 | Gil ................ H10K 59/1216 |
| 2018/0190195 | A1* | 7/2018 | Asano .................. G09G 5/18 |
| 2019/0362675 | A1 | 11/2019 | Kim et al. |
| 2020/0105849 | A1 | 4/2020 | Kim et al. |

FOREIGN PATENT DOCUMENTS

| | | |
|---|---|---|
| KR | 1020190021594 A | 3/2019 |
| KR | 1020190098315 A | 8/2019 |
| KR | 1020190133817 A | 12/2019 |
| KR | 102103963 B1 | 4/2020 |
| KR | 1020200037027 A | 4/2020 |

\* cited by examiner

*Primary Examiner* — Herve-Louis Y Assouman
(74) *Attorney, Agent, or Firm* — CANTOR COLBURN LLP

(57) ABSTRACT

A display apparatus includes first to third pixels sequentially arranged in a first direction, a first voltage line which transfers a first initialization voltage, a second voltage line which transfers a second initialization voltage, a first contact plug connecting the first pixel and the second pixel to the first voltage line, and a second contact plug connecting the second pixel and the third pixel to the second voltage line.

29 Claims, 13 Drawing Sheets

DISPLAY APPARATUS

This application claims priority to Korean Patent Application No. 10-2020-0177817, filed on Dec. 17, 2020, and all the benefits accruing therefrom under 35 U.S.C. § 119, the content of which in its entirety is herein incorporated by reference.

BACKGROUND

1. Field

Embodiments relate to display apparatuses.

2. Description of the Related Art

Display apparatuses visually display data. The display apparatuses are used as displays in small products such as cell phones, or may be used as displays in large products such as televisions.

A display apparatus includes a plurality of pixels that receive an electrical signal and emit light to display an image to the outside. Each of the pixels includes a light-emitting element. An organic light-emitting display apparatus includes an organic light-emitting diode ("OLED") as a light-emitting element, for example. In general, the organic light-emitting display apparatus with a thin-film transistor and an OLED formed on a substrate, and the OLED emits light by itself.

Recently, as a use of display apparatuses is being diversified, various designs for improving quality of display apparatuses are being attempted.

SUMMARY

Embodiments provide a display apparatus that is capable of preventing a pixel defect from occurring due to static electricity generated from the outside.

The technical feature of the invention is not limited to the technical feature described above, and other technical features not mentioned will be clearly understood by a person skilled in the art from the description of the invention.

Additional features will be set forth in part in the description which follows and, in part, will be apparent from the description, or may be learned by practice of the embodiments of the invention.

In an embodiment, a display apparatus includes first to third pixels sequentially arranged in a first direction, a first voltage line which transfers a first initialization voltage, a second voltage line which transfers a second initialization voltage, a first contact plug connecting the first pixel and the second pixel to the first voltage line, and a second contact plug connecting the second pixel and the third pixel to the second voltage line.

In an embodiment, the display apparatus may further include a plurality of pixels including the first to third pixels, and arranged in the first direction and a column direction, a plurality of first contact plugs connecting a pixel in an $i^{th}$ row and a $(2j-1)^{th}$ column and a pixel in the $i^{th}$ row and a $(2j)^{th}$ column among the plurality of pixels to the first voltage line where i and j are natural numbers, and a plurality of second contact plugs connecting the pixel in the $i^{th}$ row and the $(2j)^{th}$ column and a pixel in the $i^{th}$ row and a $(2j+1)^{th}$ column among the plurality of pixels, to the second voltage line.

In an embodiment, the plurality of first contact plugs and the plurality of second contact plugs may be alternately arranged in the first direction.

In an embodiment, the plurality of first contact plugs and the plurality of second contact plugs may be arranged in the column direction.

In an embodiment, the first voltage line may include a plurality of first perpendicular lines each extending in the column direction, and the second voltage line may include a plurality of second perpendicular lines each extending in the column direction.

In an embodiment, the plurality of first perpendicular lines and the plurality of second perpendicular lines may be alternately arranged in the first direction.

In an embodiment, each of the plurality of first perpendicular lines may be unitarily provided as a single body with the plurality of first contact plugs, and each of the plurality of second perpendicular lines may be unitarily provided as a single body with the plurality of second contact plugs.

In an embodiment, the first voltage line may further include a plurality of first parallel lines each extending in the first direction.

In an embodiment, a number of pixels in a $j^{th}$ column among the plurality of pixels arranged between first parallel lines adjacent to each other in the column direction from among the plurality of first parallel lines is k where k is a natural number.

In an embodiment, a number of pixels in the $i^{th}$ row among the plurality of pixels arranged between first perpendicular lines adjacent to each other in the first direction from among the plurality of first perpendicular lines may be 2.

In an embodiment, the plurality of first parallel lines may be respectively connected to the plurality of first perpendicular lines through a plurality of third contact plugs.

In an embodiment, the second voltage line may further include a plurality of second parallel lines each extending in the first direction.

In an embodiment, the plurality of first parallel lines and the plurality of second parallel lines may be alternately arranged with each other in the column direction.

In an embodiment, a number of pixels in the $j^{th}$ column among the plurality of pixels arranged between a first parallel line and a second parallel line adjacent to each other in the column direction from among the plurality of first parallel lines and the plurality of second parallel lines may be k, and a number of pixels in the $j^{th}$ column arranged between first parallel lines adjacent to each other in the column direction among the plurality of first parallel lines may be greater than k.

In an embodiment, a number of pixels in a $j^{th}$ column among the plurality of pixels arranged between first parallel lines adjacent to each other in the column direction among the plurality of first parallel lines may be k, and a number of pixels in the $j^{th}$ column among the plurality of pixels arranged between second parallel lines adjacent to each other in the column direction among the plurality of second parallel lines may be k.

In an embodiment, the plurality of second parallel lines may be respectively connected to the plurality of second perpendicular lines through a plurality of fourth contact plugs.

In an embodiment, each of the first to third pixels may include a light-emitting element, a driving transistor which controls a current flowing to the light-emitting element according to a gate-source voltage, a first initialization transistor which applies one of the first initialization voltage and the second initialization voltage to an electrode of the driving transistor in response to a first scan signal, and a second initialization transistor which applies a remaining one of the first initialization voltage and the second initialization voltage to an electrode of the light-emitting element in response to a second scan signal.

In an embodiment, each of the first to third pixels may further include a scan transistor which transfers a data voltage to the driving transistor in response to a third scan signal, and a storage capacitor having a first electrode and a second electrode, the second electrode being connected to a gate of the driving transistor.

In an embodiment, each of the first to third pixels may further include a compensation transistor connecting a drain of the driving transistor and the gate of the driving transistor to each other in response to the third scan signal.

In an embodiment, each of the first to third pixels may further include a first emission control transistor which transfers a driving voltage to the driving transistor in response to an emission control signal, and a second emission control transistor which connects the driving transistor and the light-emitting element to each other in response to the emission control signal.

In an embodiment, a display apparatus may include a plurality of pixels arranged in a first direction, and a semiconductor pattern unitarily provided as a single body, and continuously extending in the first direction, where pixels in a $(2j-1)^{th}$ column and pixels in a $(2j)^{th}$ column among the plurality of pixels share a plurality of first contact plugs which transfers a first initialization voltage, the pixels in the $(2j)^{th}$ column and pixels in a $(2j+1)^{th}$ column among the plurality of pixels share a plurality of second contact plugs which transfers a second initialization voltage, and the semiconductor pattern includes a plurality of pixel areas respectively included in the plurality of pixels, a plurality of first contact areas respectively corresponding to the plurality of first contact plugs, and a plurality of second contact areas respectively corresponding to the plurality of second contact plugs.

In an embodiment, each of the plurality of first contact areas may connect a $(2j-1)^{th}$ column pixel area and a $(2j)^{th}$ column pixel area among the plurality of pixel areas, and each of the plurality of second contact areas may connect the $(2j)^{th}$ column pixel area and a $(2j+1)^{th}$ pixel area among the plurality of pixel areas.

In an embodiment, the plurality of first contact areas and the plurality of second contact areas may be alternately arranged in the first direction.

In an embodiment, the display apparatus may further include a first voltage line which is connected to the plurality of first contact plugs and receives the first initialization voltage, and a second voltage line which is connected to the plurality of second contact plugs and receives the second initialization voltage.

In an embodiment, the first voltage line may include a plurality of first perpendicular lines each extending in a column direction, and the second voltage line may include a plurality of second perpendicular lines each extending in the column direction.

In an embodiment, the plurality of first perpendicular lines and the plurality of second perpendicular lines may be alternately arranged in the first direction.

In an embodiment, the first voltage line may further include a plurality of first parallel lines each extending in the first direction.

In an embodiment, a number of pixels in a $j^{th}$ column among the plurality of pixels arranged between first parallel lines adjacent to each other in the column direction from among the plurality of first parallel lines may be k.

In an embodiment, each of the plurality of pixels may include a light-emitting element, a driving transistor which controls a current flowing to the light-emitting element according to a gate-source voltage, a first initialization transistor which applies one of the first initialization voltage and the second initialization voltage to an electrode of the driving transistor in response to a first scan signal, and a second initialization transistor which applies a remaining one of the first initialization voltage and the second initialization voltage to an electrode of the light-emitting element in response to a second scan signal.

In an embodiment, each of the plurality of pixels may further include a scan transistor which transfers a data voltage to the driving transistor in response to a third scan signal, and a storage capacitor having a first electrode and a second electrode, the second electrode being connected to a gate of the driving transistor.

Other embodiments, features, and advantages other than those described above will become apparent from the detailed content, claims and drawings for carrying out the following embodiments.

These general and specific features may be carried out using a system, a method, a computer program, or any combinations thereof.

BRIEF DESCRIPTION OF THE DRAWINGS

The above and other embodiments, features, and advantages of the invention will be more apparent from the following description taken in conjunction with the accompanying drawings, in which.

DETAILED DESCRIPTION

Figure 1:
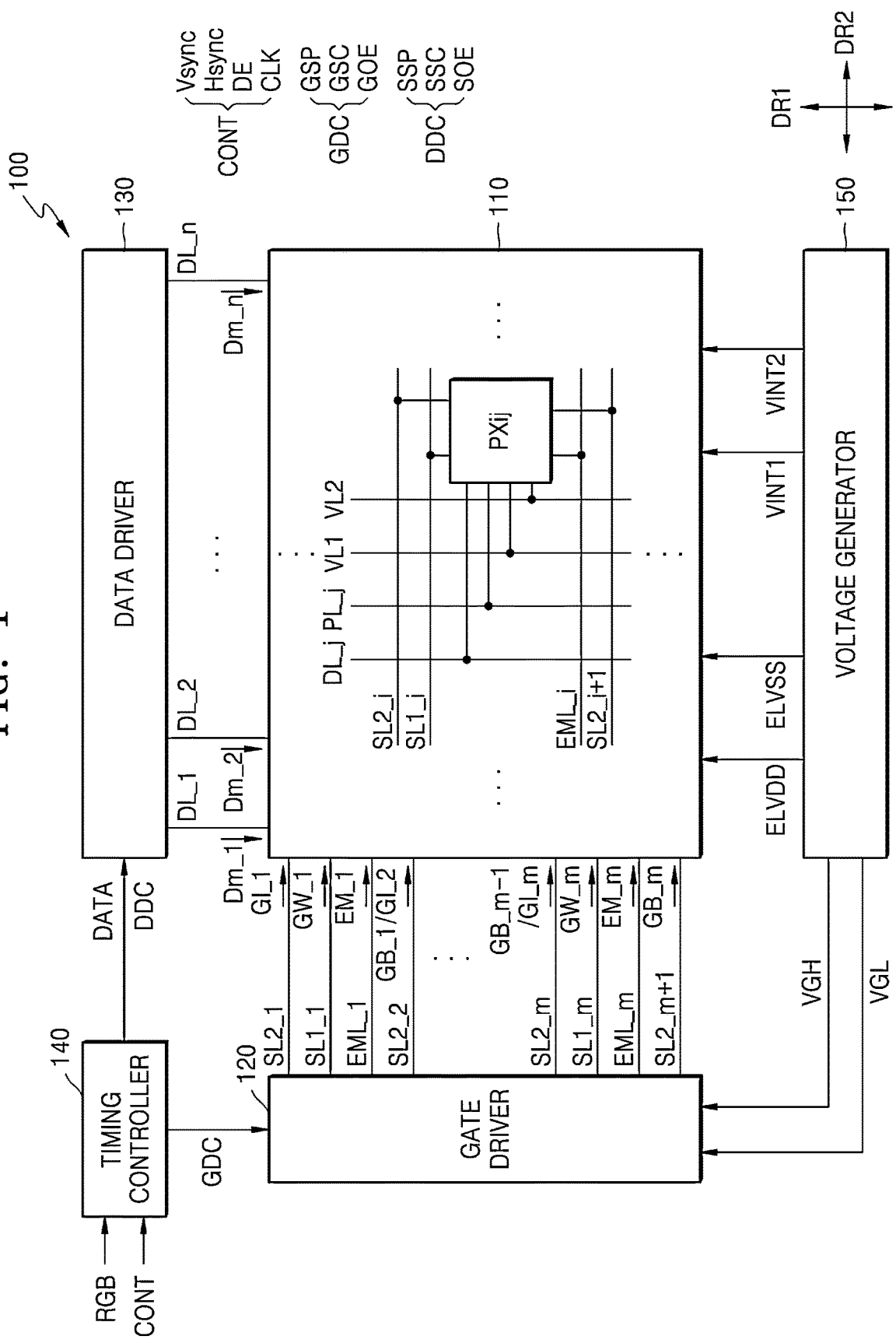
FIG. 1 is a schematic block diagram of an embodiment of a display apparatus.

Reference will now be made in detail to embodiments, examples of which are illustrated in the accompanying drawings, where like reference numerals refer to like elements throughout the disclosure. In this regard, the illustrated embodiments may have different forms and configuration and should not be construed as being limited to the descriptions set forth herein. Accordingly, the embodiments are merely described below, by referring to the drawing figures, to explain features of the invention. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any variations thereof.

Because the disclosure may have diverse modified embodiments, embodiments are illustrated in the drawings and are described with respect to the embodiments. An effect and a characteristic of the invention, and a method of accomplishing them will be apparent by referring to embodiments described with reference to the drawings. The invention may, however, be embodied in many different forms and configurations and should not be construed as limited to the embodiments set forth herein.

Embodiments of the invention will be described below in more detail with reference to the accompanying drawings. Components that are the same or are in correspondence with each other are rendered the same reference numeral regardless of the figure number, and redundant explanations are omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, area, or element is referred to as being "formed on" another layer, area, or element, it can be directly or indirectly formed on the other layer, region, or element. That is, one or more intervening layers, areas, or elements, for example, may be present therebetween.

Sizes of elements in the drawings may be exaggerated or reduced for convenience of explanation. In other words, because sizes and thicknesses of components in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

In the disclosure, the term "and/or" includes any and all combinations of one or more of the associated listed items. For example, "A and/or B" may include "A," "B," or "A and B." Throughout the disclosure, the expression "at least one of a, b, or c" indicates only a, only b, only c, both a and b, both a and c, both b and c, all of a, b, and c, or any variations thereof.

It will be understood that when a layer, region, or component is referred to as being connected to another layer, region, or component, it can be directly or indirectly connected to the other layer, region, or component. That is, intervening layers, regions, or components, for example, may be present. When layers, areas, or elements or the like are referred to as being "electrically connected," they may be directly electrically connected, or layers, areas or elements may be indirectly electrically connected, and an intervening layer, region, component, or the like may be present therebetween, for example.

The x-axis, the y-axis, and the z-axis are not limited to three axes of a rectangular coordinate system, and may be interpreted in a broader sense. The x-axis, the y-axis, and the z-axis may be perpendicular to one another, or may represent different directions that are not perpendicular to one another, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a schematic block diagram of an embodiment of a display apparatus.

The display apparatus may include an organic light-emitting display including a light-emitting element that varies in brightness by a current such as an organic light-emitting diode. In some embodiments, the display apparatus may include an inorganic light-emitting display (or an inorganic electroluminescent display apparatus) or a quantum dot light-emitting display. In other words, an emission layer of the light-emitting element included in the display apparatus may include an organic material, may include a quantum dot, may include an organic material and a quantum dot, may include an inorganic material and a quantum dot, or may include an organic material, an inorganic material, and a quantum dot. A case where the display apparatus is an organic light-emitting display will be mainly described below.

Referring to FIG. 1, an organic light-emitting display 100 includes a display unit 110, a gate driver 120, a data driver 130, a timing controller 140, and a voltage generator 150.

The display unit 110 includes pixels PX (refer to FIG. 7), such as a pixel PXij disposed in an $i^{th}$ row and a $j^{th}$ column. For convenience of description, FIG. 1 shows only one pixel, that is, the pixel PXij, but the m×n pixels PX may be arranged in a matrix form, for example. Here, m and n are natural numbers, and the i is a natural number of 1 or more and m or less, and the j is a natural number of 1 or more and n or less. However, the invention is not limited thereto, and the pixels PX may be arranged in various other forms.

Figure 3:
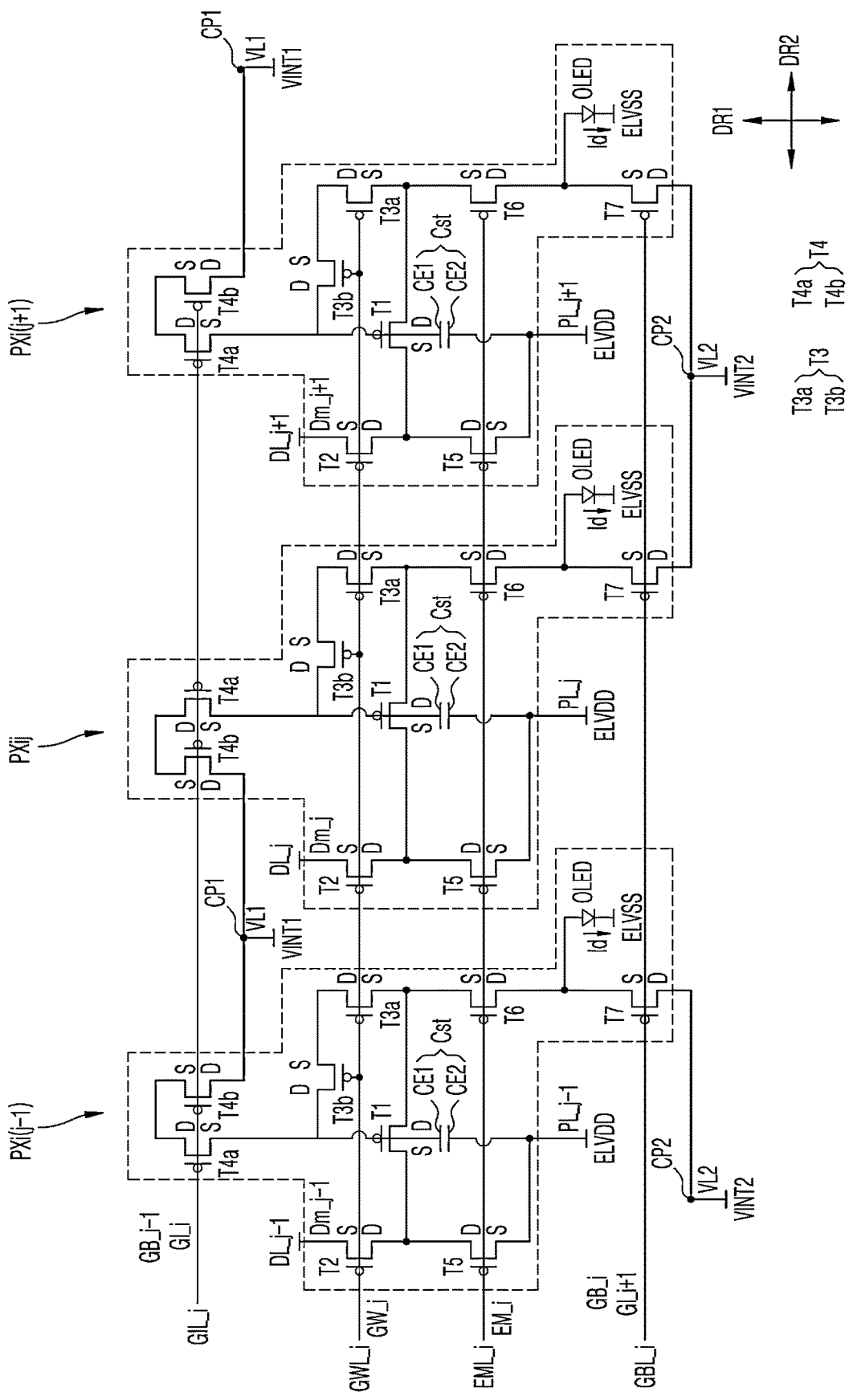
FIG. 3 shows equivalent circuit diagrams of an embodiment of a plurality of pixels.

In FIG. 3 to be described later, for illustrative purposes only, the pixel PX including seven transistors and one capacitor is mainly described. However, the disclosure is not applied only to the pixel PX employing this particular pixel circuit, but may also be equally applicable to other pixel circuits such as the pixel PX employing a pixel circuit including two transistors and one capacitor.

The pixels PX are connected to first scan lines SL1_1 to SL1_m, second scan lines SL2_1 to SL2_m+1, emission control lines EML_1 to EML_m, and data lines DL_1 to DL_n. The pixels PX are connected to power lines (e.g., PL_j), a first voltage line VL1, and a second voltage line VL2. In an embodiment, as shown in FIG. 1, the pixel PXij disposed in the $i^{th}$ row and the $j^{th}$ column may be connected to the first scan line SL1_i, the second scan line SL2_i, the emission control line EML_i, the data line DL_j, the power line PL_j, the first voltage line VL1, the second voltage line VL2, and the second scan line SL2_i+1, for example. The second scan line SL2_i+1 may be also referred to as a third scan line with respect to the pixel PXij for convenience.

In another embodiment, the pixel PXij may be connected to some of the first scan line SL1_i, the second scan line SL2_i, the emission control line EML_i, the data line DL_j, the power line PL_j, the first voltage line VL1, the second voltage line VL2, and the second scan line SL2_i+1. In an embodiment, the pixel PXij may be connected to the first scan line SL1_i, the data line DL_j, and the power line PL_j, for example.

Each of the data lines DL_1 to DL_n and the power lines (e.g., PL_j) may extend in a first direction (or a column direction) DR1 and be connected to pixels PX arranged in the same column. Each of the first scan lines SL1_1 to SL1_m, the second scan lines SL2_1 to SL2_m+1, and the emission control lines EML_1 to EML_m may extend in a second direction (or a row direction) DR2 and be connected to pixels PX arranged in the same row.

Figure 6:
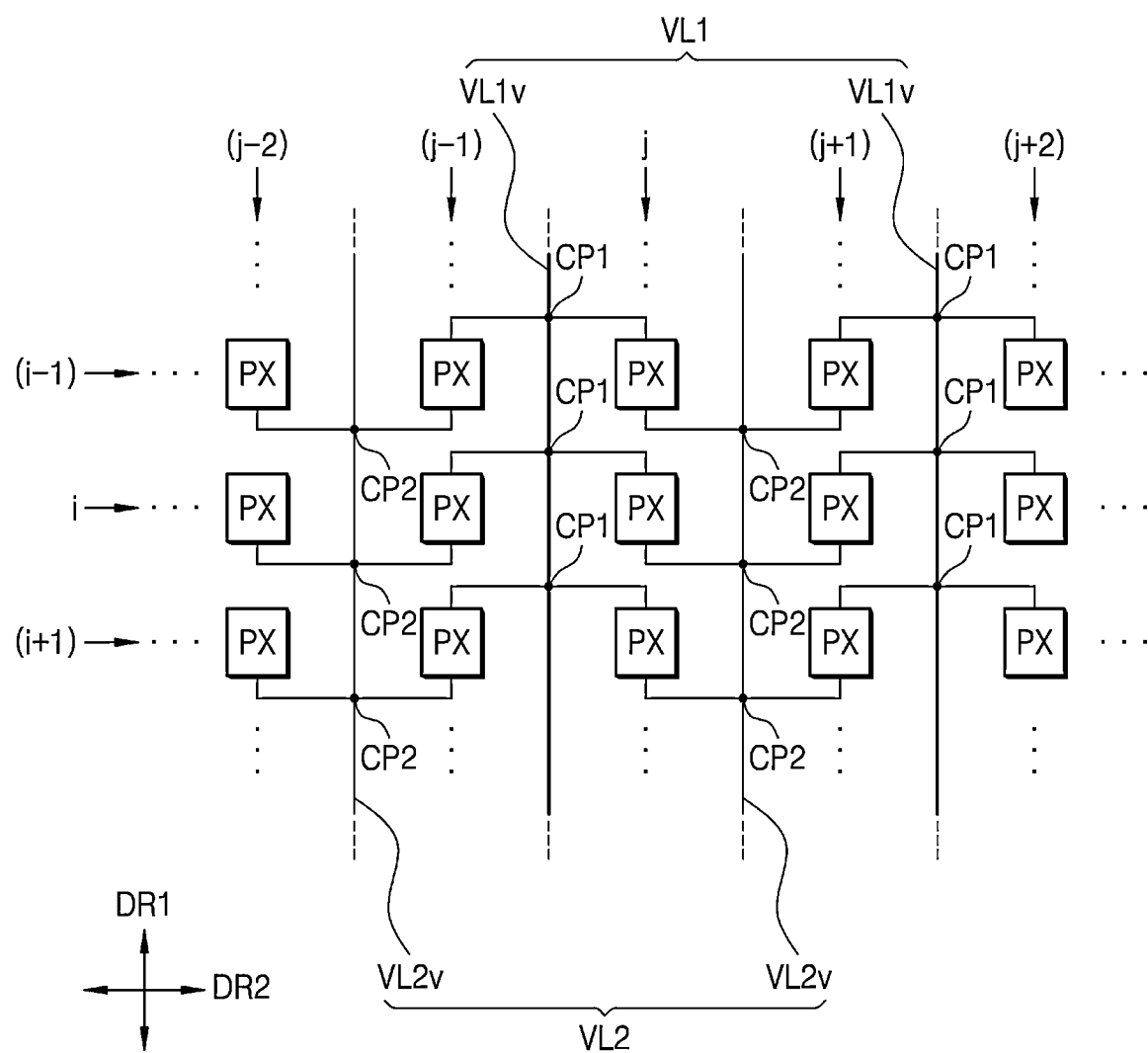
FIG. 6 shows an embodiment of a voltage line.

As shown in FIG. 6 to be described later, each of the first voltage line VL1 and the second voltage line VL2 may include a plurality of vertical lines (also referred to as perpendicular lines) extending in the first direction DR1, and the plurality of vertical lines may be connected to pixels PX arranged in the same column. In this case, the plurality of vertical lines may be shared among pixels PX neighboring each other in the second direction DR2. As shown in FIGS. 7, 9, 10, 12, and 13 to be described later, at least one of the first voltage line VL1 and the second voltage line VL2 may include a plurality of horizontal lines (also referred to as parallel lines), and may be connected to each of the plurality of vertical lines.

The first scan lines SL1_1 to SL1_m respectively transfer first scan signals GW_1 to GW_m output from the gate driver 120 to pixels PX in the same row, second scan lines SL2_1 to SL2_m respectively transfer second scan signals GI_1 to GI_m output from the gate driver 120 to pixels PX in the same row, and second scan lines SL2_2 to SL2_m+1 respectively transfer third scan signals GB_1 to GB_m output from the gate driver 120 to pixels PX in the same row. A second scan signal GI_m and a third scan signal GB_m−1 may be the same signal transferred through the second scan line SL2_m, and a second scan signal GI_i and a third scan signal GB_i−1 (refer to FIG. 3) may be the same signal transferred through the second scan line SL2_i.

The emission control lines EML_1 to EML_m respectively transfer emission control signals EM_1 to EM_m output from the gate driver 120 to pixels PX in the same row. The data lines DL_1 to DL_n respectively transfer data voltages Dm_1 to Dm_n output from the data driver 130 to pixels PX in the same column. The pixel PXij arranged in the $i^{th}$ row and the $j^{th}$ column receives first to third scan signals GW_i, GI_i, and GB_i, a data voltage Dm_j, and an emission control signal EM_i (refer to FIG. 3).

The power lines (e.g., PL_j) respectively transfer a first driving voltage ELVDD output from the voltage generator 150 to pixels PX in the same column. In another embodiment, the first driving voltage ELVDD may be transferred to pixels PX in the same row through power lines extending in the second direction DR2.

The first voltage line VL1 transfers a first initialization voltage VINT1 output from the voltage generator 150 to the pixels PX. The second voltage line VL2 transfers a second initialization voltage VINT2 output from the voltage generator 150 to the pixels PX.

The pixel PXij includes a light-emitting element and a driving transistor that controls a magnitude of a current flowing to the light-emitting element based on the data voltage Dm_j. The data voltage Dm_j is output from the data driver 130 and received by the pixel PXij via the data line DL_j. In an embodiment, the light-emitting element may include an organic light-emitting diode, for example. As the light-emitting element emits light of a brightness corresponding to the magnitude of the current received from the driving transistor, the pixel PXij may express a grayscale corresponding to the data voltage Dm_j. The pixel PX may correspond to a portion of a unit pixel capable of expressing a full color, such as a sub-pixel. The pixel PXij may further include at least one switching transistor and at least one capacitor. The pixel PXij will be described in greater detail below.

The voltage generator 150 may generate voltages desired for driving of the pixel PXij. In an embodiment, the voltage generator 150 may generate the first driving voltage ELVDD, a second driving voltage ELVSS, the first initialization voltage VINT1, and the second initialization voltage VINT2, for example. A level of the first driving voltage ELVDD may be greater than that of the second driving voltage ELVSS. A level of the second initialization voltage VINT2 may be greater than that of the first initialization voltage VINT1. The level of the second initialization voltage VINT2 may be greater than that of the second driving voltage ELVSS. A difference between the second initialization voltage VINT2 and the second driving voltage ELVSS may be less than a threshold value desired for the light-emitting element of the pixel PX to emit light.

The voltage generator 150 may generate a first gate voltage VGH and a second gate voltage VGL for controlling a switching transistor of the pixel PXij and provide the first gate voltage VGH and the second gate voltage VGL to the gate driver 120. When the first gate voltage VGH is applied to a gate of the switching transistor, the switching transistor may be turned off, and when the second gate voltage VGL is applied to the gate of the switching transistor, the switching transistor may be turned on. The first gate voltage VGH may be also referred to as a turn-off voltage, and the second gate voltage VGL may be also referred to as a turn-on voltage. The switching transistors of the pixel PXij may be p-type metal-oxide-semiconductor field-effect transistors ("MOSFETs"), and a level of the first gate voltage VGH may be greater than that of the second gate voltage VGL. Although not shown in FIG. 1, the voltage generator 150 may generate gamma reference voltages and provide the gamma reference voltages to the data driver 130.

The timing controller 140 may control the display unit 110 by controlling an operation timing of the gate driver 120 and the data driver 130. The pixels PX of the display unit 110 may receive a new data voltage Dm_1 to Dm_n every frame period and emit light of a luminance corresponding to the data voltage Dm_1 to Dm_n, thereby displaying an image corresponding to an image source data RGB of a single frame.

In an embodiment, a single frame period may include a gate initialization period, a data write and anode initialization period, and an emission period. In the gate initialization period, a synchronization with a second scan signal (GI_1 to GI_m) may be performed, and the first initialization voltage VINT1 may be applied to the pixels PX. In the data write and anode initialization period, the data voltage Dm_1 to Dm_n may be provided to the pixels PX by performing synchronization with a first scan signal GW, and the second initialization voltage VINT2 may be applied to the pixels PX by performing synchronization with a third scan signal (GB_1 to GB_m). In the emission period, the pixels PX of the display unit 110 emit light.

The timing controller 140 receives the image source data RGB and a control signal CONT from the outside. The timing controller 140 may convert the image source data RGB to an image data DATA based on characteristics of the display unit 110 and the pixels PX or the like. The timing controller 140 may provide the image data DATA to the data driver 130.

The control signal CONT may include a vertical sync signal Vsync, a horizontal sync signal Hsync, a data enable signal DE, a clock signal CLK, or the like. The timing controller 140 may control the operation timing of the gate driver 120 and the data driver 130 by the control signal CONT. The timing controller 140 may determine a frame period by counting the data enable signal DE of a horizontal scanning period. In this case, the vertical sync signal Vsync and the horizontal sync signal Hsync received from the outside may be omitted. The image source data RGB includes luminance information of the pixels PX. In an embodiment, the luminance may have a predetermined number of grayscales such as $1024(=2^{10})$ $256(=2^8)$, or $64(=2^6)$.

The timing controller 140 may generate control signals including a gate timing control signal GDC for controlling an operation timing of the gate driver 120, and a data timing control signal DDC for controlling the operation timing of the data driver 130.

The gate timing control signal GDC may include a gate start pulse GSP, a gate shift clock GSC, a gate output enable signal GOE, or the like. The gate start pulse GSP may be supplied to the gate driver 120 that generates a first scan signal at a starting time point of a scanning period. The gate shift clock GSC may include a clock signal commonly input to the gate driver 120 and a clock signal for shifting the gate start pulse GSP. The gate output enable signal GOE controls outputting by the gate driver 120.

The data timing control signal DDC may include a source start pulse SSP, a source sampling clock SSC, a source output enable signal SOE, or the like. The source start pulse SSP controls a starting time point of data sampling by the data driver 130 and is provided to the data driver 130 at a starting time point of the scanning period. The source sampling clock SSC may include a clock signal for controlling a sampling operation of data within the data driver 130 based on a rising or falling edge. The source output enable signal SOE controls outputting by the data driver 130. The source start pulse SSP provided to the data driver 130 may be omitted according to data transmission schemes.

The gate driver 120 sequentially generates the first scan signals GW_1 to GW_m, the second scan signals GI_1 to GI_m, and the third scan signals GB_1 to GB_m in response to the gate timing control signal GDC received from the timing controller 140 using the first and second gate voltages VGH and VGL provided from the voltage generator 150.

The data driver 130 samples and latches image data DATA supplied from the timing controller 140 in response to the data timing control signal DDC received from the timing controller 140, and converts the image data DATA into data of a parallel data system. When the data driver 130 converts the image data DATA into data of the parallel data system, the image data DATA is converted into a gamma reference voltage and converted into an analog data voltage. The data driver 130 provides the data voltages Dm_1 to Dm_n to the pixels PX through the data lines DL_1 to DL_n. The pixels PX receives the data voltages Dm_1 to Dm_n in response to the first scan signals GW_1 to GW_m.

Figure 2:
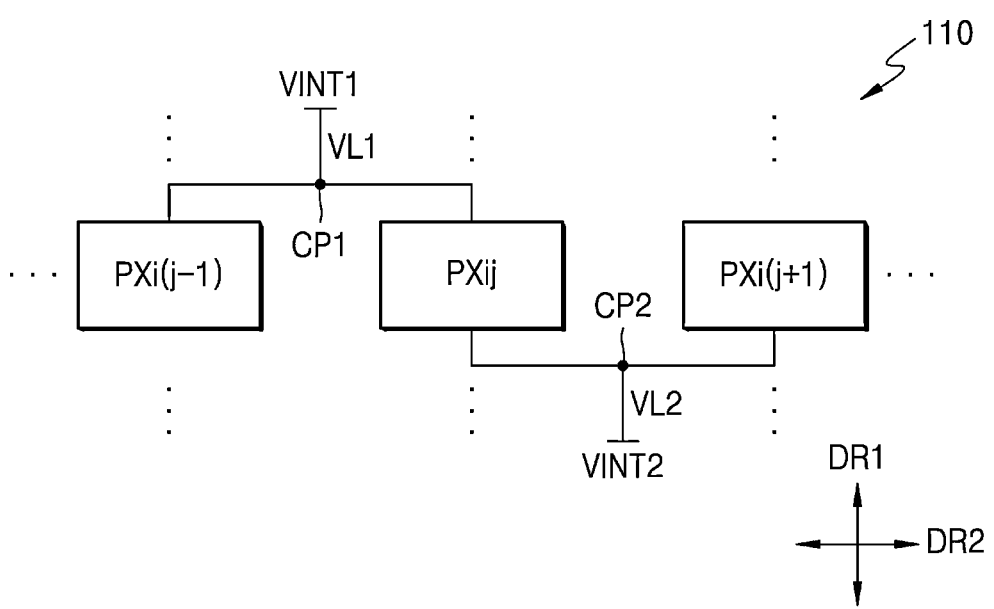
FIG. 2 schematically shows an embodiment of a plurality of pixels.

FIG. 2 schematically shows an embodiment of a plurality of pixels.

Referring to FIG. 2, the display unit 110 of the organic light-emitting display includes pixels PX (refer to FIG. 7), such as a pixel PXi(j−1) disposed in an $i^{th}$ row and a $(j−1)^{th}$ column (hereinafter referred to as a first pixel), a pixel PXij disposed in the $i^{th}$ row and a $j^{th}$ column (hereafter referred to as a second pixel), and a pixel PXi(j+1) disposed in the $i^{th}$ row and a $(j+1)^{th}$ column (hereinafter referred to as a third pixel).

The pixels PX may be arranged in a first direction (or a column direction) DR1 and a second direction (or a row direction) DR2. In an embodiment, the pixels PX may be arranged in a matrix form, for example. However, the invention is not limited thereto, and the pixels PX may be arranged in various other forms.

In an embodiment, among the first pixel PXi(j−1), the second pixel PXij, and the third pixel PXi(j+1), which are sequentially arranged in the second direction DR2, the first pixel PXi(j−1) and the second pixel PXij may share a first contact plug CP1 with each other, and the second pixel PXij and the third pixel PXi(j+1) may share a second contact plug CP2 with each other.

The first contact plug CP1 may be connected to a first voltage line VL1 to which a first initialization voltage VINT1 is applied, and the second contact plug CP2 may be connected to a second voltage line VL2 to which a second initialization voltage VINT2 is applied.

Because the first pixel PXi(j−1) and the second pixel PXij share the first contact plug CP1 with each other, the first pixel PXi(j−1) and the second pixel PXij may be connected to the first voltage line VL1 through the first contact plug CP1. Because the second pixel PXij and the third pixel PXi(j+1) share the second contact plug CP2 with each other, the second pixel PXij and the third pixel PXi(j+1) may be connected to the second voltage line VL2 through the second contact plug CP2.

In other words, the first contact plug CP1 may connect the first pixel PXi(j−1) and the second pixel PXij to the first voltage line VL1, and the second contact plug CP2 may connect the second pixel PXij and the third pixel PXi(j+1) to the second voltage line VL2.

Figure 5:
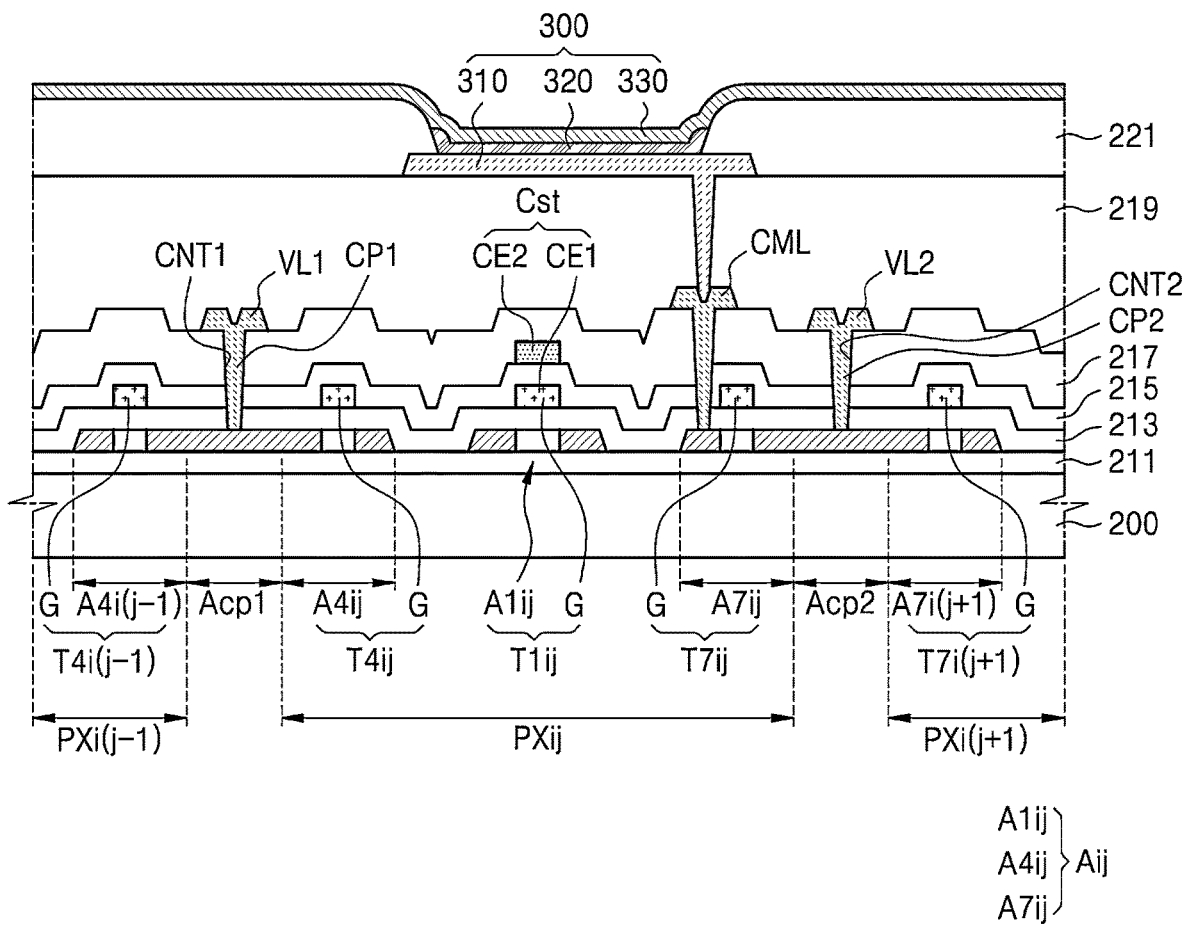
FIG. 5 is a cross-sectional view schematically illustrating an embodiment of a display apparatus.

As shown in FIG. 5 to be described later, the first contact plug CP1 and the second contact plug CP2 may correspond to a portion of a conductive layer. The first contact plug CP1 and the second contact plug CP2 may correspond to a portion of a conductive layer which is disposed in a contact hole defined in an insulating layer.

The second pixel PXij may share the first contact plug CP1 with the first pixel PXi(j−1) arranged in the previous column and may share the second contact plug CP2 with the third pixel PXi(j+1) arranged in the next column.

Although not shown in FIG. 2, like the second pixel PXij and the third pixel PXi(j+1), the first pixel PXi(j−1) may share the second contact plug CP2 with a pixel arranged in the previous column. In some embodiments, like the first pixel PXi(j−1) and the second pixel PXij, the third pixel PXi(j+1) may share the first contact plug CP1 with a pixel arranged in the next column.

In this case, the first pixel PXi(j−1) may share the second contact plug CP2 with a pixel arranged in the previous column and may share the first contact plug CP1 with the second pixel PXij arranged in the next column. The third pixel PXi(j+1) may share the second contact plug CP2 with the second pixel PXij arranged in the previous column and may share the first contact plug CP1 with a pixel arranged in the next column.

In other words, pixels arranged in the $i^{th}$ row may be connected to one another through the first contact plug CP1 and the second contact plug CP2 which are alternately arranged in the second direction DR2.

Although not shown in FIG. 2, like the pixels arranged in the $i^{th}$ row, pixels arranged in an $(i−1)^{th}$ row, pixels arranged in an (i+1)$^{th}$ row, or the like may be configured in the same way. In this case, each of the first contact plugs CP1 and the second contact plugs CP2 may be arranged in the first direction DR1.

FIG. 3 shows equivalent circuit diagrams of an embodiment of a plurality of pixels.

FIG. 3 shows a first pixel PXi(j−1), a second pixel PXij, and a third pixel PXi(j+1). Because the first pixel PXi(j−1), the second pixel PXij, and the third pixel PXi(j+1) are disposed in the same row, the first pixel PXi(j−1), the second pixel PXij, and the third pixel PXi(j+1) may be connected to the same first to third scan lines GWL_i, GIL_i, and GBL_i and the emission control line EML_i. The first pixel PXi(j−1), the second pixel PXij, and the third pixel PXi(j+1) may be sequentially arranged in the second direction DR2 and neighbor one another.

In an embodiment, the first pixel PXi(j−1) and the second pixel PXij may receive the first initialization voltage VINT1 via the first contact plug CP1, and the second pixel PXij and the third pixel PXi(j+1) may receive the second initialization voltage VINT2 via the second contact plug CP2. In other words, the first pixel PXi(j−1) and the second pixel PXij may share the first contact plug CP1 with each other, and the second pixel PXij and the third pixel PXi(j+1) may share the second contact plug CP2 with each other. In other words, the first pixel PXi(j−1) and the second pixel PXij may share the first voltage line VL1 with each other, and the second pixel PXij and the third pixel PXi(j+1) may share the second voltage line VL2 with each other.

Referring to FIG. 3, the first pixel PXi(j−1) is connected to the first to third scan lines GWL_i, GIL_i, and GBL_i for transferring first to third scan signals GW_i, GI_i, and GB_i (or GI_i+1), respectively, a data line DL_j−1 for transferring a data voltage Dm_j−1, and the emission control line EML_i for transferring an emission control signal EM_i. The first pixel PXi(j−1) is connected to a power line PL_j−1 for transferring a first driving voltage ELVDD, a first voltage line VL1 for transferring the first initialization voltage VINT1, and a second voltage line VL2 for transferring the second initialization voltage VINT2. The first pixel PXi(j−1) is connected to a common electrode to which a second driving voltage ELVSS is applied.

The first scan line GWL_i corresponds to the first scan line SL1_i in FIG. 1, the second scan line GIL_i corresponds to the second scan line SL2_i in FIG. 1, and the third scan line GBL_i corresponds to the second scan line SL2_i+1 in FIG. 1.

The second pixel PXij is connected to the first to third scan lines GWL_i, GIL_i, and GBL_i for transferring the first to third scan signals GW_i, GI_i, and GB_i (or GI_i+1), respectively, the data line DL_j for transferring the data voltage Dm_j, and the emission control line EML_i for transferring the emission control signal EM_i. The second pixel PXij is connected to a power line PL_j for transferring a first driving voltage ELVDD, the first voltage line VL1 for transferring the first initialization voltage VINT1, and the second voltage line VL2 for transferring the second initialization voltage VINT2. The second pixel PXij is connected to a common electrode to which the second driving voltage ELVSS is applied. The second pixel PXij may correspond to the pixel PXij in FIG. 1.

The third pixel PXi(j+1) is connected to the first to third scan lines GWL_i, GIL_i, and GBL_i for transferring the first to third scan signals GW_i, GI_i, and GB_i (or GI_i+1), respectively, a data line DL_j+1 for transferring a data voltage Dm_j+1, and the emission control line EML_i for transferring the emission control signal EM_i. The third pixel PXi(j+1) is connected to a power line PL_j+1 for transferring the first driving voltage ELVDD, the first voltage line VL1 for transferring the first initialization voltage VINT1, and the second voltage line VL2 for transferring the second initialization voltage VINT2. The third pixel PXi(j+1) is connected to a common electrode to which the second driving voltage ELVSS is applied.

Elements included in the first pixel PXi(j−1), the second pixel PXij, and the third pixel PXi(j+1) will be described below. Because equivalent circuit diagrams of the first pixel PXi(j−1) and the third pixel PXi(j+1) may be applied in the same manner as an equivalent circuit diagram of the second pixel PXij, the second pixel PXij will be mainly described.

The second pixel PXij includes a light-emitting element OLED, first to seventh transistors T1 to T7, and a storage capacitor Cst. The light-emitting element OLED may include an organic light-emitting diode having an anode and a cathode. The cathode may include a common electrode to which the second driving voltage ELVSS is applied.

The first transistor T1 may include a driving transistor in which a magnitude of a drain current is determined according to a gate-source voltage, and the second to seventh transistors T2 to T7 may include a switching transistor that is turned on or off according to the gate-source voltage, substantially, the gate voltage. The third transistor T3 includes a first compensation transistor T3a and a second compensation transistor T3b which are connected in series with each other. The fourth transistor T4 includes a first gate initialization transistor T4a and a second gate initialization transistor T4b which are connected in series with each other.

The first transistor T1 may be also referred to as a driving transistor, the second transistor T2 may be also referred to as a scan transistor, the third transistor T3 may be also referred to as a compensation transistor, the fourth transistor T4 may be also referred to as a gate initialization transistor, the fifth transistor T5 may be also referred to as a first emission control transistor, the sixth transistor T6 may be also referred to as a second emission control transistor, and the seventh transistor T7 may be also referred to as an anode initialization transistor.

The storage capacitor Cst is connected between the power line PL_j and the gate of the driving transistor T1. The storage capacitor Cst may include an upper electrode CE2 connected to the power line PL_j, and a lower electrode CE1 connected to the gate of the driving transistor T1.

The driving transistor T1 may control a magnitude of a driving current Id flowing to the light-emitting element OLED from the power line PL_j according to the gate-source voltage. The driving transistor T1 may include a gate connected to the lower electrode CE1 of the storage capacitor Cst, a source S connected to the power line PL_j through the first emission control transistor T5, and a drain D connected to the light-emitting element OLED through the second emission control transistor T6.

The driving transistor T1 may output a driving current Id to the light-emitting element OLED according to the gate-source voltage. A magnitude of the driving current Id is determined based on a voltage difference between the gate-source voltage of the driving transistor T1 and a threshold voltage. The light-emitting element OLED may receive the driving current Id from the driving transistor T1 and emit light of a brightness according to the magnitude of the driving current Id.

The scan transistor T2 transfers the data voltage Dm_j to the source S of the driving transistor T1 in response to the first scan signal GW_i. The scan transistor T2 may include a gate connected to the first scan line GWL_i, a source S connected to a data line DL_j, and a drain D connected to the source S of the driving transistor T1.

The first and second compensation transistors T3a and T3b are connected in series with each other between the drain D and gate of the driving transistor T1, and connect the drain D of the driving transistor T1 to the gate of the driving transistor T1 in response to the first scan signal GW_i. The first compensation transistor T3a may include a gate connected to the first scan line GWL_i, a source S connected to the drain D of the driving transistor T1, and a drain D connected to a source S of the second compensation transistor T3b. The second compensation transistor T3b may include a gate connected to the first scan line GWL_i, a source S connected to the drain D of the first compensation transistor T3a, and a drain D connected to the gate of the driving transistor T1.

In FIG. 3, the compensation transistor T3 includes two transistors which are connected in series with each other, but the compensation transistor T3 may include one transistor. In another embodiment, the compensation transistor T3 may include three or more transistors that are connected in series with each other.

The gate initialization transistor T4 applies the first initialization voltage VINT1 to the gate of the driving transistor T1 in response to the second scan signal GI_i. The gate initialization transistor T4 may include a gate connected to the second scan line GIL_i, a source S connected to the gate of the driving transistor T1, and a drain D connected to the first voltage line VL1.

The first pixel PXi(j-1) and the second pixel PXij may share the first contact plug CP1 connected to the first voltage line VL1. When the gate initialization transistors T4 of the first pixel PXi(j-1) and the second pixel PXij are turned on in response to the second scan signal GI_i, the first initialization voltage VINT1 received via the first contact plug CP1 may be applied to the gates of the driving transistors T1 of the first pixel PXi(j-1) and the second pixel PXij.

As shown in FIG. 3, the gate initialization transistor T4 may include the first gate initialization transistor T4a and the second gate initialization transistor T4b that are connected in series with each other between the gate of the driving transistor T1 and the first voltage line VL1. The first gate initialization transistor T4a may include a gate connected to the second scan line GIL_i, a source S connected to the gate of the driving transistor T1, and a drain D connected to a source S of the second gate initialization transistor T4b. The second gate initialization transistor T4b may include a gate connected to the second scan line GIL_i, the source S connected to the drain D of the first gate initialization transistor T4a, and a drain D connected to the first voltage line VL1.

In FIG. 3, the gate initialization transistor T4 includes two transistors connected in series with each other, but the gate initialization transistor T4 may include three or more transistors connected in series with one another. In another embodiment, the gate initialization transistor T4 may include one transistor.

The anode initialization transistor T7 applies the second initialization voltage VINT2 to the light-emitting element OLED in response to the third scan signal GB_i. The anode initialization transistor T7 may include a gate connected to the third scan line GBL_i, a source S connected to the anode of the light-emitting element OLED, and a drain D connected to the second voltage line VL2.

The second pixel PXij and the third pixel PXi(j+1) may share the second contact plug CP2 connected to the second voltage line VL2. When the anode initialization transistors T7 of the second pixel PXij and the third pixel PXi(j+1) are turned on in response to the third scan signal GB_i, the second initialization voltage VINT2 received via the second contact plug CP2 may be applied to each of the anodes of the light-emitting elements OLED of the second pixel PXij and the third pixel PXi(j+1).

The first emission control transistor T5 may connect the power line PL_j and the source S of the driving transistor T1 to each other in response to the emission control signal EM_i. The first emission control transistor T5 may include a gate connected to the emission control line EML_i, a source S connected to the power line PL_j, and a drain D connected to the source S of the driving transistor T1.

The second emission control transistor T6 may connect the drain D of the driving transistor T1 and the anode of the light-emitting element OLED to each other in response to the emission control signal EM_i. The second emission control transistor T6 may include a gate connected to the emission control line EML_i, a source S connected to the drain D of the driving transistor T1, and a drain D connected to the anode of the light-emitting element OLED.

The second scan signal GI_i may be substantially synchronized with a first scan signal GW_i-1 of the previous row. The third scan signal GB_i may be substantially synchronized with the first scan signal GW_i. In another embodiment, the third scan signal GB_i may be synchronized with a first scan signal GW_i+1 of the next row.

A predetermined operation process of a pixel of an organic light-emitting display in an embodiment will be described in detail below.

First, when the emission control signal EM_i of a high level is received, the first emission control transistor T5 and the second emission control transistor T6 are turned off, the driving transistor T1 stops outputting the driving current Id, and the light-emitting element OLED stops emitting light.

Thereafter, during a gate initialization period in which the second scan signal GI_i of a low level is received, the gate initialization transistor T4 is turned on, and the first initialization voltage VINT1 is applied to the gate of the driving transistor T1, that is, a lower electrode CE1 of the storage capacitor Cst. A voltage difference (ELVDD–VINT1) between the first driving voltage ELVDD and the first initialization voltage VINT1 is stored in the storage capacitor Cst.

Thereafter, during a data write period in which the first scan signal GW_i of a low level is received, the scan transistor T2 and the compensation transistor T3 are turned on, and the data voltage Dm_j is received by the source S of the driving transistor T1. By the compensation transistor T3, the driving transistor T1 is diode-connected, and biased in a forward direction. A gate voltage of the driving transistor T1 rises from the first initialization voltage VINT1. When the gate voltage of the driving transistor T1 is equal to a data compensation voltage (Dm_j–|Vth|) obtained by subtracting the data voltage Dm_j by a threshold voltage Vth of the driving transistor T1, the driving transistor T1 is turned off, and the gate voltage of the driving transistor T1 stops rising. Thus, a voltage difference (ELVDD–Dm_j+|Vth|) between the first driving voltage ELVDD and the data compensation voltage (Dm_j–|Vth|) is stored in the storage capacitor Cst.

In addition, during an anode initialization period in which the third scan signal GB_i of a low level is received, the anode initialization transistor T7 is turned on, and the second initialization voltage VINT2 is applied to the anode of the light-emitting element OLED. By applying the second initialization voltage VINT2 to the anode of the light-emitting element OLED to completely stop the light-emitting element OLED from emitting light, a phenomenon in which the light-emitting element OLED emits fine light in response to the black grayscale in the next frame may be eliminated.

A level of the second initialization voltage VINT2 may be greater than a level of the first initialization voltage VINT1, and may be less than a voltage level which is greater than the second driving voltage ELVSS by the threshold voltage of the light-emitting element OLED. The light-emitting element OLED has a relatively large size, and thus has a considerably large capacitance. Moreover, the level of the first initialization voltage VINT1 is so low that the light-emitting element OLED starts to emit light after a considerable delay time in the next frame. However, in the illustrated embodiment, by initializing the anode of the light-emitting element OLED with the second initialization voltage VINT2 having a level higher than that of the first initialization voltage VINT1, the light-emitting element OLED may start to emit light in a short time in the next frame. In other words, the light emission delay problem may be resolved.

The first scan signal GW_i and the third scan signal GB_i may be substantially synchronized with each other, and in this case, a data write period and an anode initialization period may be the same period.

Thereafter, when the emission control signal EM_i of a low level is received, the first emission control transistor T5 and the second emission control transistor T6 may be turned on, the driving transistor T1 may output the driving current Id corresponding to the voltage stored in the storage capacitor Cst, that is, a voltage (ELVDD−Dm_j) obtained by subtracting the source-gate voltage (ELVDD−Dm_j+|th|) of the driving transistor T1 by the threshold voltage (|Vth|), and the light-emitting element OLED may emit light of a luminance corresponding to a magnitude of the driving current Id.

Figure 4:
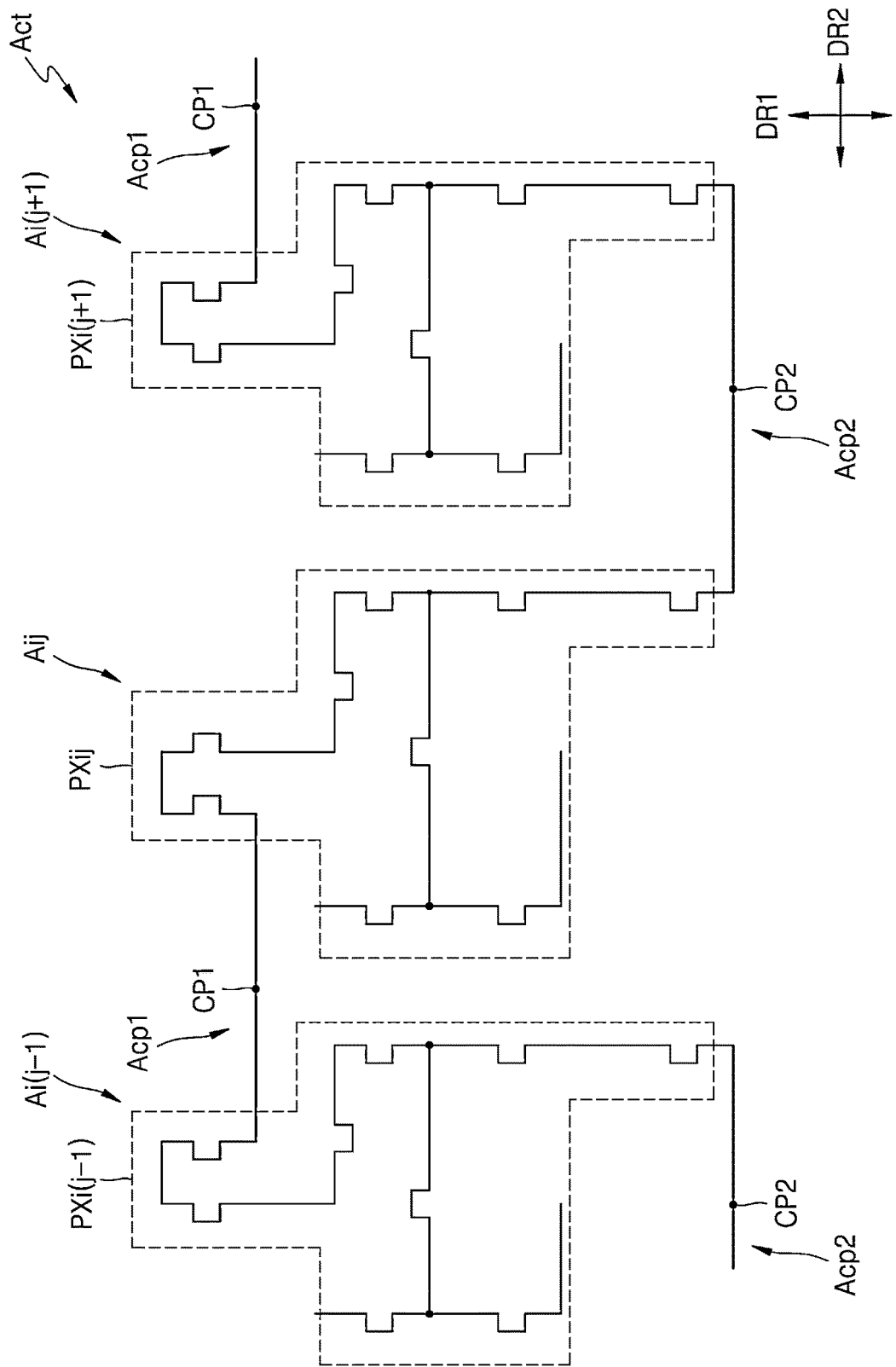
FIG. 4 shows an embodiment of a semiconductor pattern.

FIG. 4 shows an embodiment of a semiconductor pattern Act.

Referring to FIG. 4, a display unit of an organic light-emitting display apparatus may include the semiconductor pattern Act.

The semiconductor pattern Act may continuously extend in the second direction DR2. The semiconductor pattern Act may extend in the second direction DR2 without a disconnection and be unitarily provided as a single body. The semiconductor pattern Act shown in FIG. 4 partially extends in the first direction DR1, but may mainly extend in the second direction DR2 as a whole. In other words, the semiconductor pattern Act includes a portion extending in the first direction DR1 microscopically, but may mainly extend in the second direction DR2 as a whole.

The semiconductor pattern Act may include a plurality of pixel areas Ai(j−1), Aij, and Ai(j+1), and a plurality of first contact areas Acp1 and a plurality of second contact areas Acp2 that are arranged between the plurality of pixel areas Ai(j−1), Aij, and Ai(j+1).

The plurality of pixel areas Ai(j−1), Aij, and Ai(j+1) may be included in a plurality of pixels PXi(j−1), PXij, and PXi(j+1), respectively. The plurality of first contact areas Acp1 may correspond to a plurality of first contact plugs CP1, respectively, and the plurality of second contact areas Acp2 may correspond to a plurality of second contact plugs CP2, respectively. In some embodiments, as shown in FIG. 5 to be described later, the plurality of first contact areas Acp1 may be in direct contact with the plurality of first contact plugs CP1, respectively, and the plurality of second contact areas Acp2 may be in direct contact with the plurality of second contact plugs CP2, respectively.

In an embodiment, the first contact areas Acp1 and the second contact areas Acp2 may be alternately arranged in the second direction DR2.

The first contact area Acp1 may connect the pixel area Ai(j−1) of the first pixel PXi(j−1) and the pixel area Aij of the second pixel PXij to each other, and the second contact area Acp2 may connect the pixel area Aij of the second pixel PXij and the pixel area Ai(j+1) of the third pixel PXi(j+1) to each other. As described above with reference to FIG. 2, like the second pixel PXij and the third pixel PXi(j+1), the first pixel PXi(j−1) may share the second contact plug CP2 with a pixel arranged in the previous column, and like the first pixel PXi(j−1) and the second pixel PXij, the third pixel PXi(j+1) may share the first contact plug CP1 with a pixel arranged in the next column. Thus, the pixel area Ai(j−1) of the first pixel PXi(j−1) and the pixel area of the pixel arranged in the previous column may be connected to each other by the second contact area Acp2, and the pixel area Ai(j+1) of the third pixel PXi(j+1) and the pixel area of the pixel arranged in the next column may be connected to each other by the first contact area Acp1.

In a comparative example, a semiconductor pattern may not continuously extend in the row direction, and may include a plurality of island patterns that are apart from one another. Island patterns included in each of the plurality of pixels may not be connected to one another. During a process of proceeding with a subsequent process after the semiconductor pattern is formed, static electricity may be generated (or introduced) from the outside. When the semiconductor pattern includes island patterns apart from one another, the static electricity that is generated (or introduced) may be isolated in each of the island patterns. Thus, the semiconductor pattern affected by the static electricity may be damaged, and the damaged semiconductor pattern may cause a pixel defect.

However, when the semiconductor pattern Act continuously extends in the second direction DR2 as in an embodiment of the invention, static electricity generated (or introduced) from the outside may not be isolated but may be dispersed (or move) in the second direction DR2. Because the static electricity is not isolated and may be dispersed in the second direction DR2 within the semiconductor pattern Act, the semiconductor pattern Act may be prevented from being damaged.

FIG. 5 is a cross-sectional view schematically illustrating an embodiment of a display apparatus.

FIG. 5 shows a portion of each of the first pixel PXi(j−1), the second pixel PXij, and the third pixel PXi(j+1), and some elements may be omitted therein.

The first pixel PXi(j−1) may include a gate initialization transistor T4i(j−1), the second pixel PXij may include a driving transistor T1ij, a gate initialization transistor T4ij, and an anode initialization transistor T7ij, and the third pixel PXi(j+1) may include an anode initialization transistor T7i(j+1).

The gate initialization transistor T4i(j−1) of the first pixel PXi(j−1) may include an active area A4i(j−1) and a gate electrode G. The active area A4i(j−1) of the gate initialization transistor T4i(j−1) of the first pixel PXi(j−1) may correspond to a portion of the pixel area Ai(j−1) of the first pixel PXi(j−1).

The driving transistor T1ij of the second pixel PXij may include an active area A1ij and a gate electrode G, the gate initialization transistor T4ij of the second pixel PXij may include an active area A4ij and a gate electrode G, and the anode initialization transistor T7ij of the second pixel PXij may include an active area A7ij and a gate electrode G. Each of the active area A1*ij* of the driving transistor T1*ij* of the second pixel PXij, the active area A4*ij* of the gate initialization transistor T4*ij* of the second pixel PXij, and the active area A7*ij* of the anode initialization transistor T7*ij* of the second pixel PXij may correspond to a portion of the pixel area Aij of the second pixel PXij.

The anode initialization transistor T7*i*(j+1) of the third pixel PXi(j+1) may include an active area A7*i*(j+1) and a gate electrode G. The active area A7*i*(j+1) of the anode initialization transistor T7*i*(j+1) of the third pixel PXi(j+1) may correspond to a portion of the pixel area Ai(j+1) of the third pixel PXi(j+1).

The active area A4*i*(j−1) of the gate initialization transistor T4*i*(j−1) of the first pixel PXi(j−1) and the active area A4*ij* of the gate initialization transistor T4*ij* of the second pixel PXij may be connected to each other by the first contact area Acp1. The active area A7*ij* of the anode initialization transistor T7*ij* of the second pixel PXij and the active area A7*i*(j+1) of the anode initialization transistor T7*i*(j+1) of the third pixel PXi(j+1) may be connected to each other by the second contact area Acp2.

A multi-layer stacked in a display apparatus or the like will be described in detail below with reference to FIG. 5.

In an embodiment, a substrate 200 may include a glass material, a ceramic material, a metal material, or a material that is flexible or bendable. In an embodiment, when the substrate 200 is flexible or bendable, the substrate 200 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 200 may have a single-layer or multi-layer structure of the materials, and may further include an inorganic layer in the case of a multi-layer structure. In some embodiments, the substrate 200 may have a structure of an organic material, an inorganic material, and another organic material.

A buffer layer 211 may reduce or block the penetration of foreign materials, moisture, or ambient air from below the substrate 200 and may provide a flat surface on the substrate 200. In an embodiment, the buffer layer 211 may include an inorganic material such as an oxide or a nitride, may include an organic material, or may include an organic and inorganic compound. In addition, the buffer layer 211 may include a single-layer or multi-layer structure of an inorganic material and an organic material.

A barrier layer (not shown) may be further included between the substrate 200 and the buffer layer 211. The barrier layer may prevent or minimize the penetration of impurities into the active areas A4*i*(j−1), A1*ij*, A4*ij*, A7*ij*, and A7*i*(j+1) from the substrate 200 or the like. In an embodiment, the barrier layer may include an inorganic material such as an oxide or a nitride, may include an organic material, or may include an organic and inorganic compound. In addition, the barrier layer may include a single-layer or multi-layer structure including an inorganic material and an organic material.

The active areas A4*i*(j−1), A1*ij*, A4*ij*, A7*ij*, and A7*i*(j+1), the first contact area Acp1, and the second contact area Acp2 may be arranged on the buffer layer 211. The active areas A4*i*(j−1), A1*ij*, A4*ij*, A7*ij*, and A7*i*(j+1), the first contact area Acp1, and the second contact area Acp2 may include amorphous silicon or polysilicon.

In another embodiment, the active areas A4*i*(j−1), A1*ij*, A4*ij*, A7*ij*, and A7*i*(j+1), the first contact area Acp1, and the second contact area Acp2 may include an oxide semiconductor material. In an embodiment, the active areas A4*i*(j−1), A1*ij*, A4*ij*, A7*ij*, and A7*i*(j+1), the first contact area Acp1, and the second contact area Acp2 may include an oxide of at least one material of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn), for example.

In an embodiment, the active areas A4*i*(j−1), A1*ij*, A4*ij*, A7*ij*, and A7*i*(j+1), the first contact area Acp1, and the second contact area Acp2 may include an InSnZnO ("ITZO") semiconductor layer, an InGaZnO ("IGZO") semiconductor layer, or the like, for example. Because an oxide semiconductor has a wide band gap (about 3.1 electron-volts (eV)), high carrier mobility, and low leakage current, a voltage drop is not large even when a driving time is long, and thus, a luminance change due to the voltage drop is not large even in the case of a low-frequency driving.

Each of the active areas A4*i*(j−1), A1*ij*, A4*ij*, A7*ij*, and A7*i*(j+1) may include a channel area, and a source area and a drain area respectively arranged at opposite sides of the channel area. The active areas A4*i*(j−1), A1*ij*, A4*ij*, A7*ij*, and A7*i*(j+1) may include a single layer or multiple layers.

A first gate insulating layer 213 and a second gate insulating layer 215 may be stacked on the substrate 200 so that the active areas A4*i*(j−1), A1*ij*, A4*ij*, A7*ij*, and A7*i*(j+1), the first contact area Acp1, and the second contact area Acp2 are covered. The first gate insulating layer 213 and the second gate insulating layer 215 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). $ZnO_x$ may be ZnO, and/or $ZnO_2$.

The gate electrodes G may be arranged on the first gate insulating layer 213. In an embodiment, each of the gate electrodes G may include a conductive material including molybdenum (Mo), Al, copper (Cu), Ti, or the like, and may include a single-layer or a multi-layer that include the above-described materials. In an embodiment, each of the gate electrodes G may have a multi-layer structure of a Ti layer, an Al layer, and another Ti layer, for example.

The gate electrodes G may at least partially overlap the active areas A4*i*(j−1), A1*ij*, A4*ij*, A7*ij*, and A7*i*(j+1), respectively. In an embodiment, the gate electrodes G may overlap the channel areas of the active areas A4*i*(j−1), A1*ij*, A4*ij*, A7*ij*, and A7*i*(j+1), respectively, for example.

In an embodiment, the storage capacitor Cst may include a lower electrode CE1 and an upper electrode CE2 and may overlap the driving transistor T1*ij* as shown in FIG. 5. In an embodiment, the gate electrode G of the driving transistor T1*ij* may function as the lower electrode CE1 of the storage capacitor Cst. Unlike the above, the storage capacitor Cst may not overlap the driving transistor T1*ij* and may be separate from the driving transistor T1*ij*, for example.

The upper electrode CE2 of the storage capacitor Cst may overlap the lower electrode CE1 with the second gate insulating layer 215 therebetween, and may form a capacitor. In this case, the second gate insulating layer 215 may function as a dielectric layer of the storage capacitor Cst. In an embodiment, the upper electrode CE2 of the storage capacitor Cst may include a conductive layer including Mo, Al, Cu, Ti, or the like, and may have a multi-layer or single-layer structure including the above-described materials. In an embodiment, the upper electrode CE2 of the storage capacitor Cst may have a multi-layer structure of a Ti layer, an Al layer, and another Ti layer, for example.

An inter-insulating layer 217 may be provided on the second gate insulating layer 215 to cover the upper electrode CE2 of the storage capacitor Cst. The inter-insulating layer 217 may include $SiO_2$, $SiN_x$, SiON, $Al_2O_3$, $TiO_2$, $Ta_2O_5$, $HfO_2$, $ZnO_x$, or the like. $ZnO_x$ may be ZnO, and/or $ZnO_2$.

A conductive layer may be arranged on the inter-insulating layer 217. In an embodiment, the conductive layer may include a conductive material including Mo, Al, Cu, Ti, or the like, and may include a multi-layer or a single layer including the above-described materials. In an embodiment, the conductive layer may have a multi-layer structure of a Ti layer, an Al layer, and another Ti layer, for example.

The conductive layer may include a connection line CML, a first voltage line VL1, and a second voltage line VL2.

The connection line CML, the first voltage line VL1, and the second voltage line VL2 may be respectively connected to the active areas A4$i$(j−1), A1$ij$, A4$ij$, A7$ij$, and A7$i$(j+1), the first contact area Acp1, and the second contact area Acp2 through contact holes defined in the insulating layers.

In an embodiment, the connection line CML may be connected to the active area A7$ij$ of the anode initialization transistor T7$ij$ of a second pixel PX$ij$ through a contact hole defined in the first gate insulating layer 213, the second gate insulating layer 215, and the inter-insulating layer 217, for example. The connection line CML may connect a light-emitting element 300 and the anode initialization transistor T7$ij$ of the second pixel PX$ij$ to each other.

The first voltage line VL1 may be connected to the first contact area Acp1 through a first contact hole CNT1 defined in the first gate insulating layer 213, the second gate insulating layer 215, and the inter-insulating layer 217. A portion of the first voltage line VL1 may be disposed in the first contact hole CNT1, and the portion of the first voltage line VL1 disposed in the first contact hole CNT1 may be also referred to as a first contact plug CP1. In other words, the first voltage line VL1 and the first contact plug CP1 may be unitarily provided as a single body.

The second voltage line VL2 may be connected to the second contact area Acp2 through a second contact hole CNT2 defined in the first gate insulating layer 213, the second gate insulating layer 215, and the inter-insulating layer 217. A portion of the second voltage line VL2 may be disposed in the second contact hole CNT2, and the portion of the second voltage line VL2 disposed in the second contact hole CNT2 may be also referred to as a second contact plug CP2. In other words, the second voltage line VL2 and the second contact plug CP2 may be unitarily provided as a single body.

In FIG. 5, the first voltage line VL1 and the second voltage line VL2 are arranged on the inter-insulating layer 217. However, in another embodiment, the first voltage line VL1 and the second voltage line VL2 may be arranged on the first gate insulating layer 213 or the second gate insulating layer 215.

The conductive layer may be covered with an inorganic protective layer (not shown). The inorganic protective layer may include a single layer or a multi-layer of silicon nitride ($SiN_x$) and silicon oxide ($SiO_x$). The inorganic protective layer may be introduced to cover and protect some lines arranged on the inter-insulating layer 217.

A planarization layer 219 may be arranged on the inter-insulating layer 217, and a light-emitting element 300 may be arranged on the planarization layer 219.

The planarization layer 219 may include a single layer or a multi-layer including an organic material and may provide a flat upper surface. In an embodiment, the planarization layer 219 may include a general-purpose polymer such as benzocyclobutene ("BCB"), polyimide, hexamethyldisiloxane ("HMDSO"), poly(methyl methacrylate) ("PMMA"), or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any blends thereof.

The light-emitting element 300 may be arranged on the planarization layer 219. The light-emitting element 300 may include a pixel electrode 310, an intermediate layer 320 including an organic emission layer, and an opposite electrode 330.

The pixel electrode 310 may include a (semi-)light-transmitting electrode or a reflective electrode. In some embodiments, the pixel electrode 310 may include a reflective layer including at least one of silver (Ag), magnesium (Mg), Al, platinum (Pt), palladium (Pd), gold (Au), nickel (Ni), neodymium (Nd), iridium (Ir), Cr, and any compounds thereof, and a transparent or translucent electrode layer formed or provided on the reflective layer. The transparent or translucent electrode layer may include at least one of indium tin oxide ("ITO"), indium zinc oxide ("IZO"), ZnO, $In_2O_3$, indium gallium oxide ("IGO"), and aluminum zinc oxide ("AZO"). In some embodiments, the pixel electrode 310 may have a structure of an ITO layer, an Ag layer, and another ITO layer.

A pixel-defining layer 221 may be arranged on the planarization layer 219. In addition, the pixel-defining layer 221 may prevent an arc or the like at an edge of the pixel electrode 310 by increasing a distance between the edge of the pixel electrode 310 and the opposite electrode 330 on the pixel electrode 310.

In an embodiment, the pixel-defining layer 221 may include one or more inorganic insulating materials including at least one of polyimide, polyamide, acrylic resin, BCB, and phenol resin.

The intermediate layer 320 may be arranged within an opening provided by the pixel-defining layer 221. The intermediate layer 320 may include an organic emission layer. In an embodiment, the organic emission layer may include a fluorescent material or a phosphorescent material that emits red, green, blue, or white light. However, the invention is not limited thereto, and organic emission layer may include a fluorescent material or a phosphorescent material that emits various other color lights. In an embodiment, the organic emission layer may include a low-molecular weight organic material or a polymer organic material, and a functional layer such as a hole transport layer ("HTL"), a hole injection layer ("HIL"), an electron transport layer ("ETL"), or an electron injection layer ("EIL") may be selectively further arranged below and above the organic emission layer.

The intermediate layer 320 may be arranged to correspond to each of the plurality of pixel electrodes 310. However, the invention is not limited thereto. The intermediate layer 320 may include a layer which is unitarily provided as a single body over the plurality of pixel electrodes 310, and various modifications may be made.

The opposite electrode 330 may be a light-transmitting electrode or a reflective electrode. In some embodiments, the opposite electrode 330 may include a transparent electrode or a translucent electrode, and may include a metal thin-film having a low work function and including Li, calcium (Ca), LiF, Al, Ag, Mg, or any compounds thereof, or a material with a multilayer structure such as LiF/Ca or LiF/Al. Also, a transparent conductive oxide ("TCO") layer including ITO, IZO, ZnO, or $In_2O_3$ may be further arranged on the metal thin-film. The opposite electrode 330 may be arranged over the display unit, and may be arranged on the intermediate layer 320 and the pixel-defining layer 221. The opposite electrode 330 may be unitarily provided as a single body for the plurality of light-emitting elements 300 to correspond to the plurality of pixel electrodes 310.

The light-emitting element 300 may be covered with an encapsulation layer (not shown). The encapsulation layer may include at least one organic encapsulation layer and at least one inorganic encapsulation layer.

In an embodiment, the inorganic encapsulation layer may include one or more inorganic materials among $Al_2O_3$, $TiO_2$, $Ta_2O_5$, $HfO_2$, $ZnO_x$, $SiO_2$, $SiN_x$, and SiON. $ZnO_x$ may be ZnO, and/or $ZnO_2$. A first inorganic encapsulation layer and a second inorganic encapsulation layer may include a single layer or a multi-layer including the materials described above. The organic encapsulation layer may include a polymer-based material. In an embodiment, the polymer-based material may include an acryl-based resin such as PMMA and polyacrylic acid, an epoxy-based resin, polyimide, or polyethylene. In an embodiment, the organic encapsulation layer may include an acrylate polymer.

FIG. 6 shows an embodiment of a voltage line.

Referring to FIG. 6, a display apparatus includes pixels PX arranged in the first direction DR1 and the second direction DR2, a first voltage line VL1, and a second voltage line VL2.

Among the plurality of pixels PX, pixels arranged in a $(j-1)^{th}$ column and pixels arranged in a $j^{th}$ column, and pixels arranged in a $(j+1)^{th}$ column and pixels arranged in a $(j+2)_{th}$ column may respectively share the first contact plugs CP1.

In an embodiment, as shown in FIG. 6, a pixel arranged in an $(i-1)^{th}$ row and the $(j-1)^{th}$ column and a pixel arranged in the $(i-1)^{th}$ row and the $j^{th}$ column, a pixel arranged in the $(i-1)^{th}$ row and the $(j+1)^{th}$ column and a pixel arranged in the $(i-1)^{th}$ row and the $(j+2)^{th}$ column, a pixel arranged in an $i^{th}$ row and the $(j-1)^{th}$ column and a pixel arranged in the $i^{th}$ row and the $j^{th}$ column, a pixel arranged in the $i^{th}$ row and the $(j+1)^{th}$ column and a pixel arranged in the $i^{th}$ row and the $(j+2)^{th}$ column, a pixel arranged in an $(i+1)^{th}$ row and the $(j-1)^{th}$ column and a pixel arranged in the $(i+1)^{th}$ row and the $j^{th}$ column, and a pixel arranged in the $(i+1)^{th}$ row and the $(j+1)^{th}$ column and a pixel arranged in the $(i+1)^{th}$ row and the $(j+2)^{th}$ column may respectively share the first contact plugs CP1, for example.

Among the plurality of pixels PX, pixels arranged in a $(j-2)^{th}$ column and pixels arranged in the $(j-1)^{th}$ column, and pixels arranged in the $j^{th}$ column and pixels arranged in the $(j+1)^{th}$ column may share the second contact plugs CP2, respectively.

In an embodiment, as shown in FIG. 6, a pixel arranged in the $(i-1)^{th}$ row and the $(j-2)^{th}$ column and a pixel arranged in the $(i-1)^{th}$ row and the $(j-1)^{th}$ column, a pixel arranged in the $(i-1)^{th}$ row the $j^{th}$ column and a pixel arranged in the $(i-1)^{th}$ row and the $(j+1)^{th}$ column, a pixel arranged in the $i^{th}$ row and the $(j-2)^{th}$ column and a pixel arranged in the $i^{th}$ row and the $(j-1)^{th}$ column, a pixel arranged in the $i^{th}$ row and the $j^{th}$ column and a pixel arranged in the $i^{th}$ row and the $(j+1)^{th}$ column, a pixel arranged in the $(i+1)^{th}$ row and the $(j-2)$th column and a pixel arranged in the $(i+1)^{th}$ row and the $(j-1)^{th}$ column, and a pixel arranged in the $(i+1)^{th}$ row and the $j^{th}$ column and a pixel arranged in the $(i+1)^{th}$ row and the $(j+1)$th column may respectively share the second contact plugs CP2, for example.

The first contact plugs CP1 and the second contact plugs CP2 may be arranged in the first direction DR1. The first contact plugs CP1 and the second contact plugs CP2 may be alternately arranged with each other in the second direction DR2.

The first voltage line VL1 may include a plurality of first vertical lines (also referred to as first perpendicular lines) VL1v each extending in the first direction DR1. Because the first contact plug CP1 is connected to the first voltage line VL1 to which a first initialization voltage is applied, the first contact plug CP1 may be connected to the first vertical line VL1v.

In an embodiment, some of the plurality of first contact plugs CP1 may be connected to the same first vertical line VL1v among the plurality of first vertical lines VL1v. In an embodiment, as shown in FIG. 6, the first contact plugs CP1 arranged in the same column among the plurality of first contact plugs CP1 may be connected to the same first vertical line VL1v among the plurality of first vertical lines VL1v, for example.

The second voltage line VL2 may include a plurality of second vertical lines (also referred to as second perpendicular lines) VL2v each extending in the first direction DR1. Because the second contact plug CP2 is connected to the second voltage line VL2 to which a second initialization voltage is applied, the second contact plug CP2 may be connected to the second vertical line VL2v.

In an embodiment, some of the plurality of second contact plugs CP2 may be connected to the same second vertical line VL2v among the plurality of second vertical lines VL2v. In an embodiment, as shown in FIG. 6, the second contact plugs CP2 arranged in the same column among the plurality of second contact plugs CP2 may be connected to the same second vertical line VL2v among the plurality of second vertical lines VL2v, for example.

In an embodiment, the first vertical lines VL1v and the second vertical lines VL2v may be alternately arranged with each other in the second direction DR2. Because the first contact plugs CP1 and the second contact plugs CP2 may be alternately arranged with each other in the second direction DR2 as described above, the first vertical lines VL1v and the second vertical lines VL2v may also be alternately arranged with each other in the second direction DR2.

In other words, the number of pixels in the $i^{th}$ row arranged between the first vertical lines VL1v that are adjacent to each other in the second direction DR2 among the plurality of first vertical lines VL1v may be two. The number of pixels in the $i^{th}$ row arranged between the second vertical lines VL2v that are adjacent to each other in the second direction DR2 among the plurality of second vertical lines VL2v may be two.

As described above, some or all of the pixels PX may share the first contact plug CP1 and/or the second contact plug CP2 to receive the first initialization voltage and/or the second initialization voltage. In this case, the number of first vertical lines VL1v for applying the first initialization voltage may be less than the number of pixels PX (or the number of pixel columns) in the second direction DR2. The number of second vertical lines VL2v for applying the second initialization voltage may be less than the number of pixel columns. In some embodiments, a sum of the number of first vertical lines VL1v and the number of second vertical lines VL2v may be less than the number of pixel columns.

The first vertical line VL1v and the second vertical line VL2v may respectively correspond to the first voltage line VL1 and the second voltage line VL2 described above with reference to FIG. 5. Thus, the first vertical line VL1v may be unitarily provided as a single body with the first contact plug CP1, and the second vertical line VL2ν may be unitarily provided as a single body with the second contact plug CP2.

Figure 7:
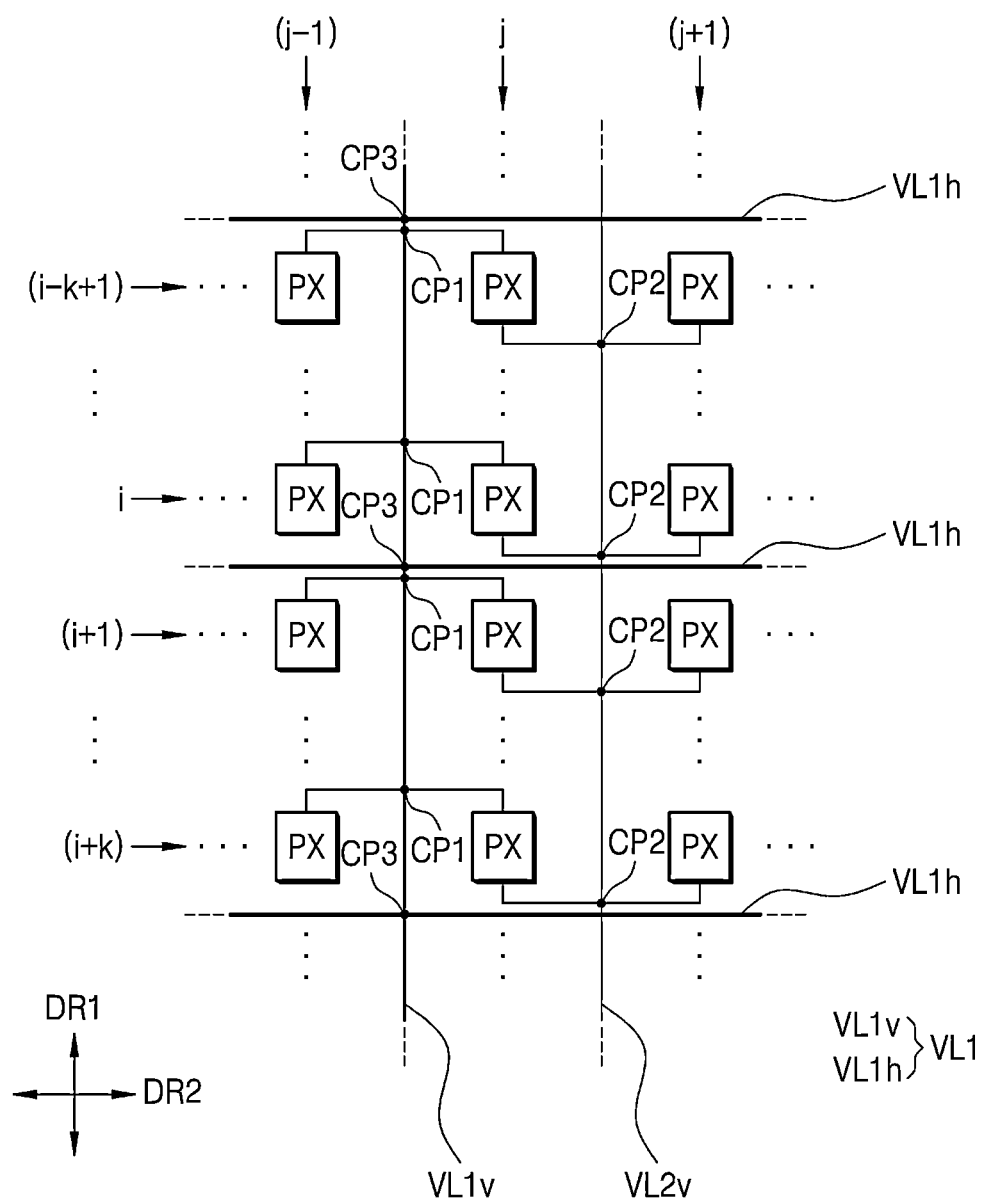
FIG. 7 shows another embodiment of a voltage line.
Figure 8:
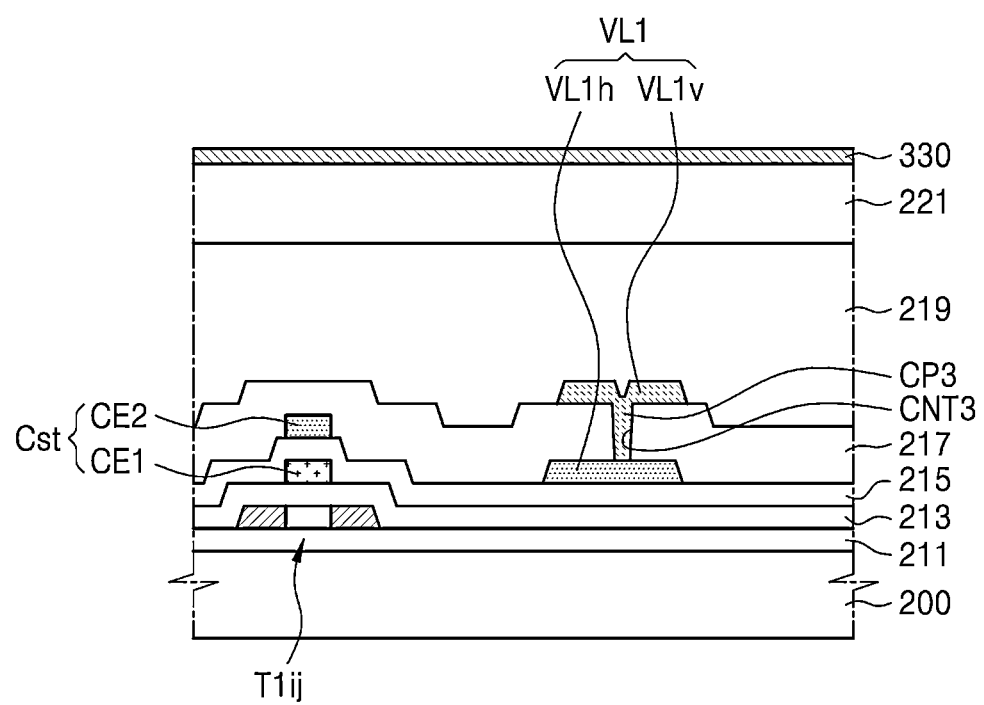
FIG. 8 is a cross-sectional view schematically illustrating the voltage line of FIG. 7.
Figure 9:
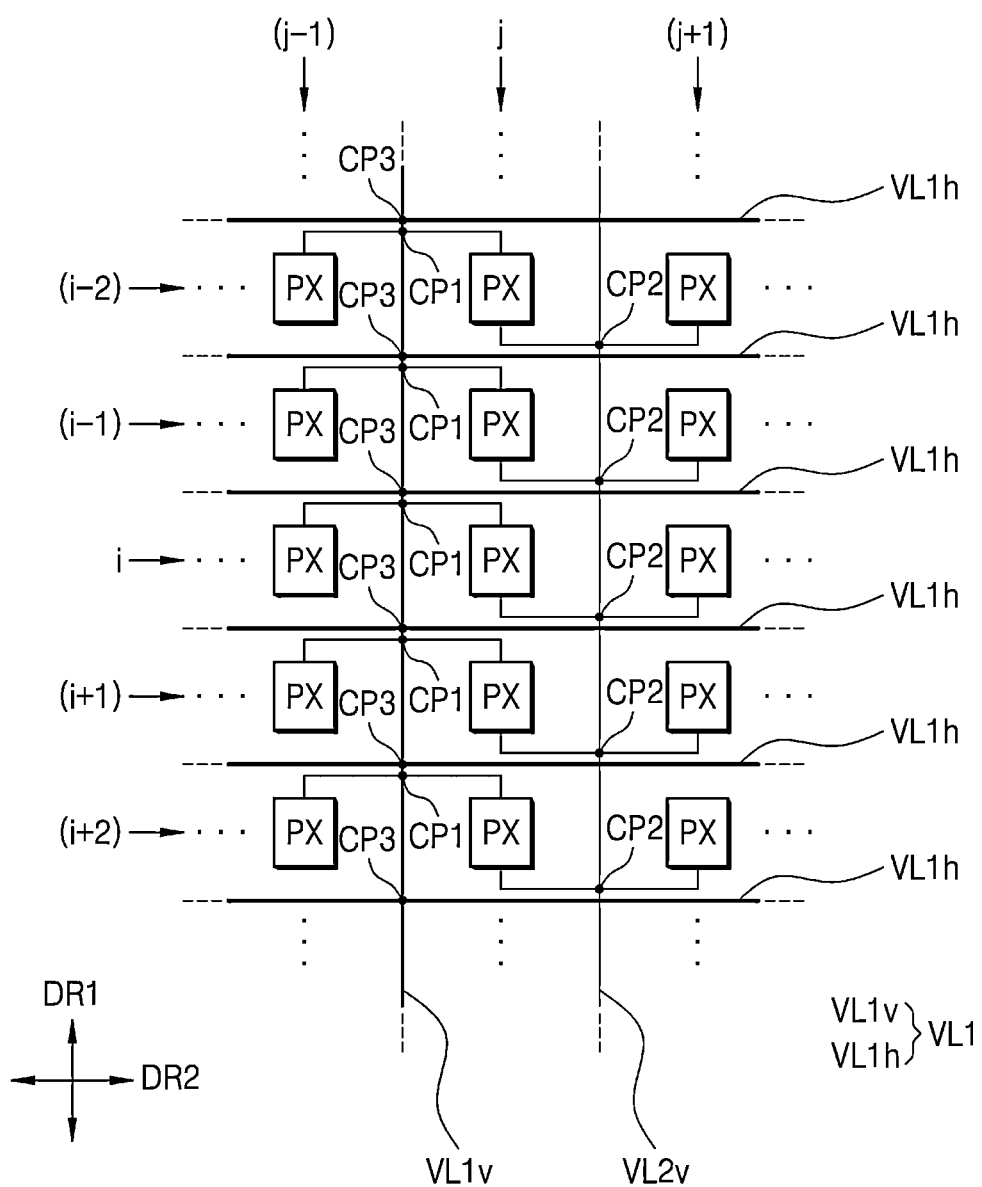
FIG. 9 shows an embodiment of FIG. 7.

FIG. 7 shows another embodiment of a voltage line. FIG. 8 is a cross-sectional view schematically illustrating the voltage line in FIG. 7. FIG. 9 shows an example of FIGS. 7 to 9 are modifications of FIG. 6, differing in a first voltage line. In FIGS. 7 to 9, descriptions overlapping with the description of FIG. 6 will be omitted, and differences will be mainly described below.

Referring to FIG. 7, the first voltage line VL1 may further include a plurality of first horizontal lines (also referred to as first parallel lines) VL1h each extending in the second direction DR2.

The plurality of first horizontal lines VL1h may be connected to the plurality of first vertical lines VL1ν through a plurality of third contact plugs CP3, respectively.

In an embodiment, as shown in FIG. 8, the first horizontal line VL1h may be arranged on the second gate insulating layer 215, and the first vertical line VL1ν may be arranged on the inter-insulating layer 217. A third contact hole CNT3 may be defined in the inter-insulating layer 217, for example. The third contact hole CNT3 may overlap (or expose) at least a portion of the first horizontal line VL1h.

A portion of the first vertical line VL1ν may be disposed in the third contact hole CNT3, and the portion of the first vertical line VL1ν disposed in the third contact hole CNT3 may be also referred to as a third contact plug CP3. The third contact plug CP3 may be in contact with the first horizontal line VL1h and may connect the first vertical line VL1ν to the first horizontal line VL1h.

In FIG. 8, the first horizontal line VL1h is arranged on the second gate insulating layer 215, and the first vertical line VL1ν is arranged on the inter-insulating layer 217. However, in another embodiment, the first horizontal line VL1h may be arranged on the inter-insulating layer 217, and the first vertical line VL1ν may be arranged on the second gate insulating layer 215. In another embodiment, the first horizontal line VL1h may be arranged on the first gate insulating layer 213.

In another embodiment, the first horizontal line VL1h and the first vertical line VL1ν may be provided in the same layer. In other words, the first horizontal line VL1h and the first vertical line VL1ν may be in direct contact with each other. In this case, the third contact plug CP3 may correspond to a portion where the first horizontal line VL1h and the first vertical line VL1ν are in contact with each other. In other words, the third contact plug CP3 may correspond to a portion where the first horizontal line VL1h and the first vertical line VL1ν cross each other.

In FIG. 7, the first contact plug CP1 and the third contact plug CP3 do not overlap each other, but in another embodiment, the first contact plug CP1 and the third contact plug CP3 may overlap each other. In addition, positions of the first contact plug CP1 and the third contact plug CP3 may be changed according to a position of the first horizontal line VL1h.

In an embodiment, the number of pixels in the $j^{th}$ column arranged between the first horizontal lines VL1h that are adjacent to each other in the first direction DR1 among the plurality of first horizontal lines VL1h may be k. Here, k is a natural integer of 1 or more and m or less. In an embodiment, as shown in FIG. 7, pixels arranged in an $(i-k+1)^{th}$ row to the $i^{th}$ row may be arranged between the first horizontal lines VL1h that are adjacent to each other in the first direction DR1, for example. In some embodiments, pixels arranged in the $(i+1)^{th}$ row to an $(i+k)^{th}$ row may be arranged between the first horizontal lines VL1h that are adjacent to each other in the first direction DR1.

When k is 1, the first horizontal lines VL1h may be respectively arranged between the pixels PX adjacent to each other in the first direction DR1. In an embodiment, as shown in FIG. 9, the first horizontal lines VL1h may be respectively arranged between pixels arranged in an $(i-2)^{th}$ row and pixels arranged in the $(i-1)^{th}$ row, between the pixels arranged in the $(i-1)^{th}$ row and pixels arranged in the $i^{th}$ row, between the pixels arranged in the $i^{th}$ row and pixels arranged in the $(i+1)^{th}$ row, and between the pixels arranged in the $(i+1)^{th}$ row and pixels arranged in an $(i+2)^{th}$ row, for example.

In FIG. 7, the number of pixels in the $j^{th}$ column arranged between the first horizontal lines VL1h adjacent to each other in the first direction DR1 among the plurality of first horizontal lines VL1h is constant at k, but the number may not be constant at k and may be inconsistent.

Figure 10:
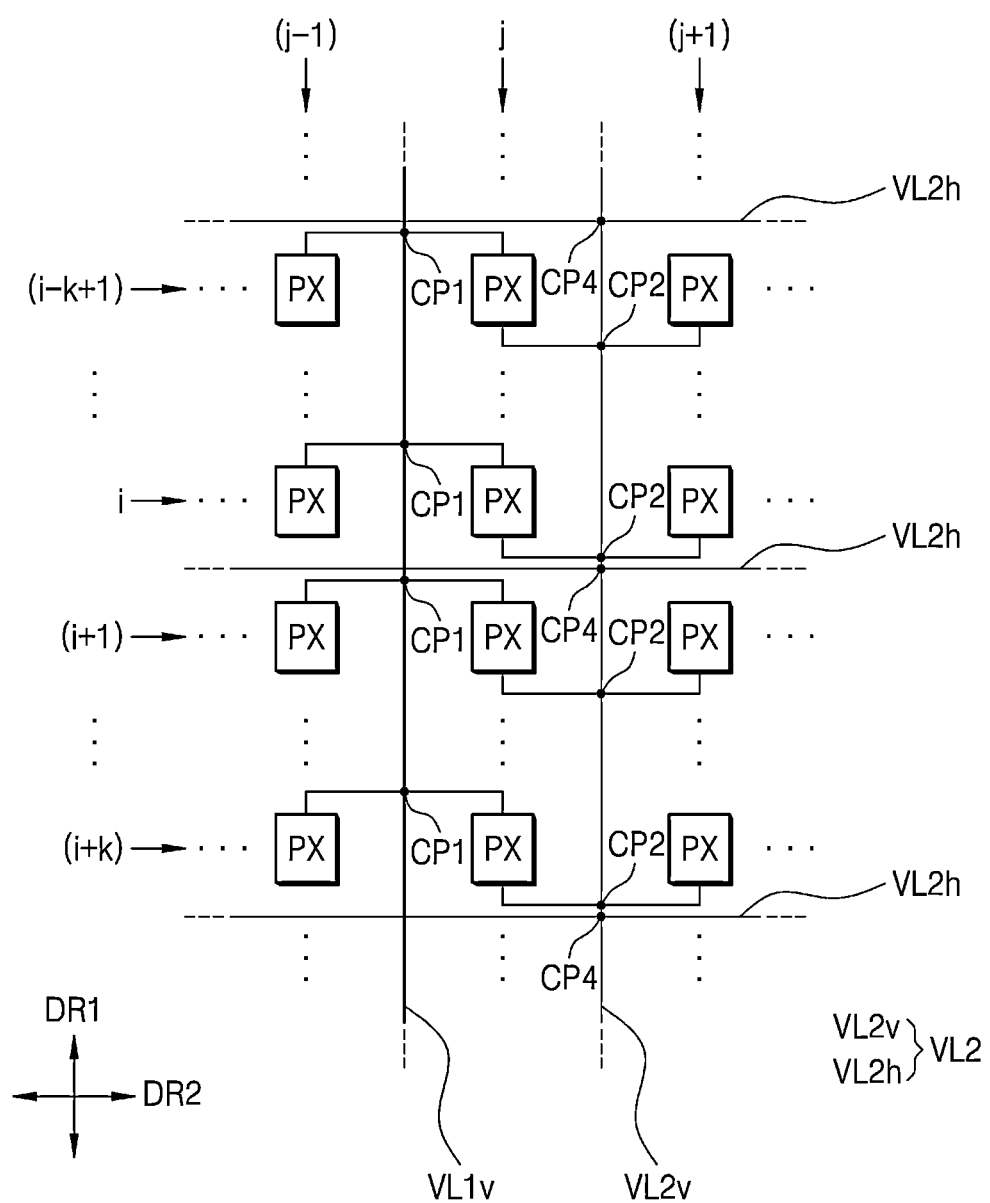
FIG. 10 shows another embodiment of a voltage line.
Figure 11:
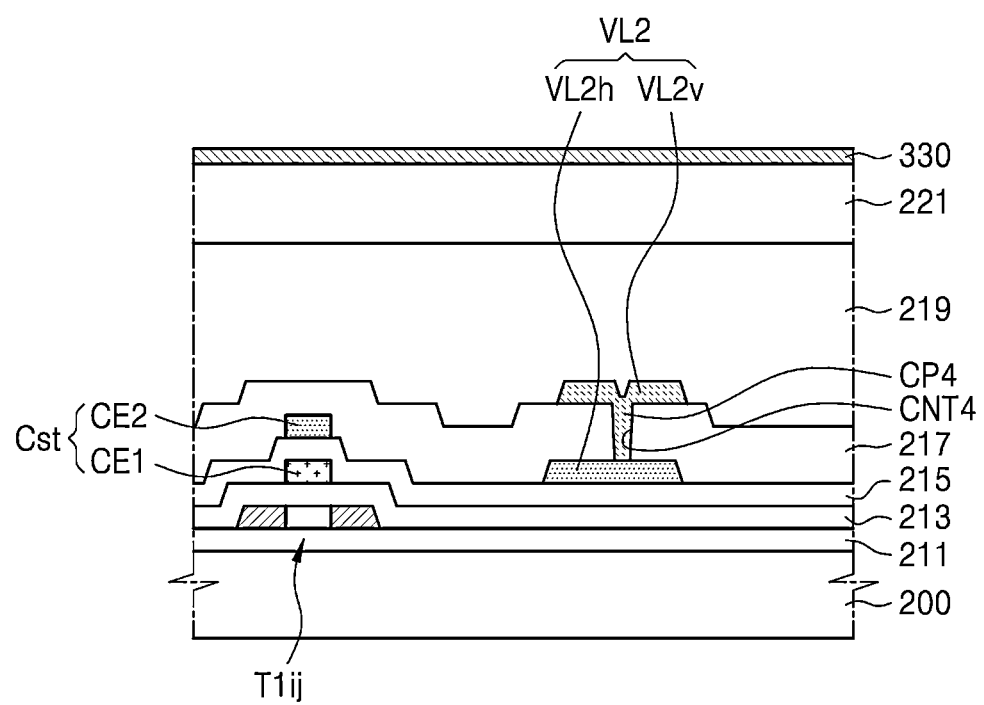
FIG. 11 is a cross-sectional view schematically illustrating the voltage line of FIG. 10.

FIG. 10 shows another embodiment of a voltage line. FIG. 11 is a cross-sectional view schematically illustrating the voltage line in FIG. 10. FIGS. 10 and 11 are modifications of FIG. 6, differing in a second voltage line. In FIGS. 10 and 11, descriptions overlapping with the description of FIG. 6 will be omitted, and differences will be mainly described below.

Referring to FIG. 10, the second voltage line VL2 may further include a plurality of second horizontal lines (also referred to as second parallel lines) VL2h each extending in the second direction DR2.

The plurality of second horizontal lines VL2h may be connected to the plurality of second horizontal lines VL2h through a plurality of fourth contact plugs CP4, respectively.

In an embodiment, as shown in FIG. 11, the second horizontal line VL2h may be arranged on the second gate insulating layer 215, and the second vertical line VL2ν may be arranged on the inter-insulating layer 217, for example. A fourth contact hole CNT4 may be defined in the inter-insulating layer 217. The fourth contact hole CNT4 may overlap (or expose) at least a portion of the second horizontal line VL2h.

A portion of the second vertical line VL2ν may be disposed in the fourth contact hole CNT4, and the portion of the second vertical line VL2ν disposed in the fourth contact hole CNT4 may be also referred to as a fourth contact plug CP4. The fourth contact plug CP4 may be in contact with the second horizontal line VL2h and may connect the second vertical line VL2ν to the second horizontal line VL2h.

In FIG. 11, the second horizontal line VL2h is arranged on the second gate insulating layer 215, and the second vertical line VL2ν is arranged on the inter-insulating layer 217. However, in another embodiment, the second horizontal line VL2h may be arranged on the inter-insulating layer 217, and the second vertical line VL2ν may be arranged on the second gate insulating layer 215. In another embodiment, the second horizontal line VL2h may be arranged on the first gate insulating layer 213.

In another embodiment, the second horizontal line VL2h and the second vertical line VL2ν may be provided in the same layer. In other words, the second horizontal line VL2h and the second vertical line VL2ν may be in direct contact with each other. In this case, the fourth contact plug CP4 may correspond to a portion where the second horizontal line VL2h and the second vertical line VL2ν are in contact with each other. In other words, the fourth contact plug CP4 may correspond to a portion where the second horizontal line VL2h and the second vertical line VL2ν cross each other.

In FIG. 10, the second contact plug CP2 and the fourth contact plug CP4 do not overlap each other, but in another embodiment, the second contact plug CP2 and the fourth contact plug CP4 may overlap each other. In addition, positions of the second contact plug CP2 and the fourth contact plug CP4 may be changed according to a position of the second horizontal line VL2h.

In an embodiment, the number of pixels in the $j^{th}$ column arranged between the second horizontal lines VL2h that are adjacent to each other in the first direction DR1 among the plurality of second horizontal lines VL2h may be k. Here, k is a natural integer of 1 or more and m or less. In an embodiment, as shown in FIG. 10, pixels arranged in an $(i-k+1)^{th}$ row to the $i^{th}$ row may be arranged between the second horizontal lines VL2h adjacent to each other in the first direction DR1, for example. In some embodiments, pixels arranged in the $(i+1)^{th}$ row to an $(i+k)^{th}$ row may be arranged between the second horizontal lines VL2h adjacent to each other in the first direction DR1. When k is 1, the second horizontal lines VL2h may be arranged between the pixels PX adjacent to each other in the first direction DR1, respectively.

In FIG. 10, the number of pixels in the $j^{th}$ column arranged between the second horizontal lines VL2h adjacent to each other in the first direction DR1 among the plurality of second horizontal lines VL2h is constant at k, but the number may not be constant at k and may be inconsistent.

Figure 12:
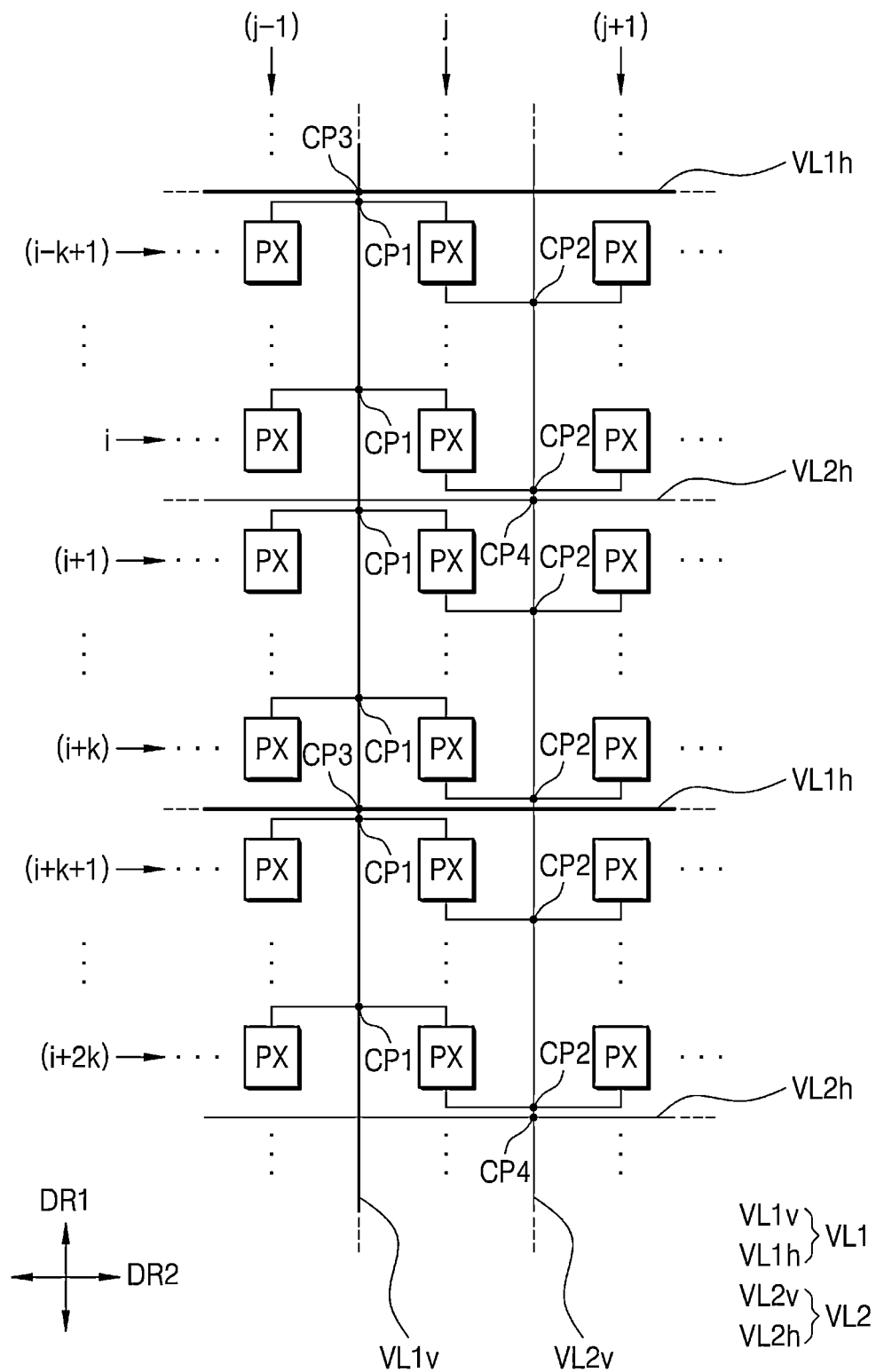
FIG. 12 shows another embodiment of a voltage line.

FIG. 12 shows another embodiment of a voltage line. FIG. 12 is a modification of FIGS. 6, 7, and 10, differing in a first voltage line and a second voltage line. In FIG. 12, descriptions overlapping with the description of FIGS. 6, 7, and 10 will be omitted, and differences will be mainly described below.

Referring to FIG. 12, the first voltage line VL1 may further include the plurality of first horizontal lines VL1h each extending in the second direction DR2, and the second voltage line VL2 may further include the plurality of second horizontal lines VL2h each extending in the second direction DR2.

The plurality of first horizontal lines VL1h may be connected to the plurality of first vertical lines VL1v through the plurality of third contact plugs CP3, respectively, and the plurality of second horizontal lines VL2h may be connected to the plurality of second vertical lines VL2v through the plurality of fourth contact plugs CP4, respectively.

In an embodiment, the first horizontal lines VL1h and the second horizontal lines VL2h may be alternately arranged with each other in the first direction DR1. In other words, the third contact plugs CP3 and the fourth contact plugs CP4 may be alternately arranged with each other in the first direction DR1.

In an embodiment, the number of pixels in the $j^{th}$ column arranged between the first horizontal line VL1h and the second horizontal line VL2h adjacent to each other in the first direction DR1 among the plurality of first horizontal lines VL1h and the plurality of second horizontal lines VL2h may be k. In an embodiment, as shown in FIG. 12, pixels arranged in the $(i-k+1)^{th}$ row to the $i^{th}$ row may be arranged between the first horizontal line VL1h and the second horizontal line VL2h adjacent to each other in the first direction DR1, for example. In some embodiments, pixels arranged in the $(i+1)^{th}$ row to the $(i+k)$th row may be arranged between the first horizontal line VL1h and the second horizontal line VL2h adjacent to each other in the first direction DR1. In some embodiments, pixels arranged in the $(i+k+1)^{th}$ row to the $(i+2k)^{th}$ row may be arranged between the first horizontal line VL1h and the second horizontal line VL2h adjacent to each other in the first direction DR1.

In other words, the number of pixels in the $j^{th}$ column arranged between the first horizontal lines VL1h that are adjacent to each other in the first direction DR1 among the plurality of first horizontal lines VL1h may be 2k. In an embodiment, as shown in FIG. 12, pixels arranged in an $(i-k+1)^{th}$ row to the $(i+k)^{th}$ row may be arranged between the first horizontal lines VL1h that are adjacent to each other in the first direction DR1, for example.

In addition, the number of pixels in the $j^{th}$ column arranged between the second horizontal lines VL2h that are adjacent to each other in the first direction DR1 among the plurality of second horizontal lines VL2h may be 2k. In an embodiment, as shown in FIG. 12, pixels arranged in the $(i+1)^{th}$ row to the $(i+2k)^{th}$ row may be arranged between the second horizontal lines VL2h that are adjacent to each other in the first direction DR1, for example.

As described above, when the first horizontal line VL1h is arranged between the pixels PX adjacent to each other in the first direction DR1, the second horizontal line VL2h may be omitted, and when the second horizontal line VL2h is arranged between the pixels PX adjacent to each other in the first direction DR1, the first horizontal line VL1h may be omitted. In another embodiment, all of the first horizontal line VL1h and the second horizontal line VL2h may be arranged between the pixels PX adjacent to each other in the first direction DR1. This will be described later below with reference to FIG. 13.

Figure 13:
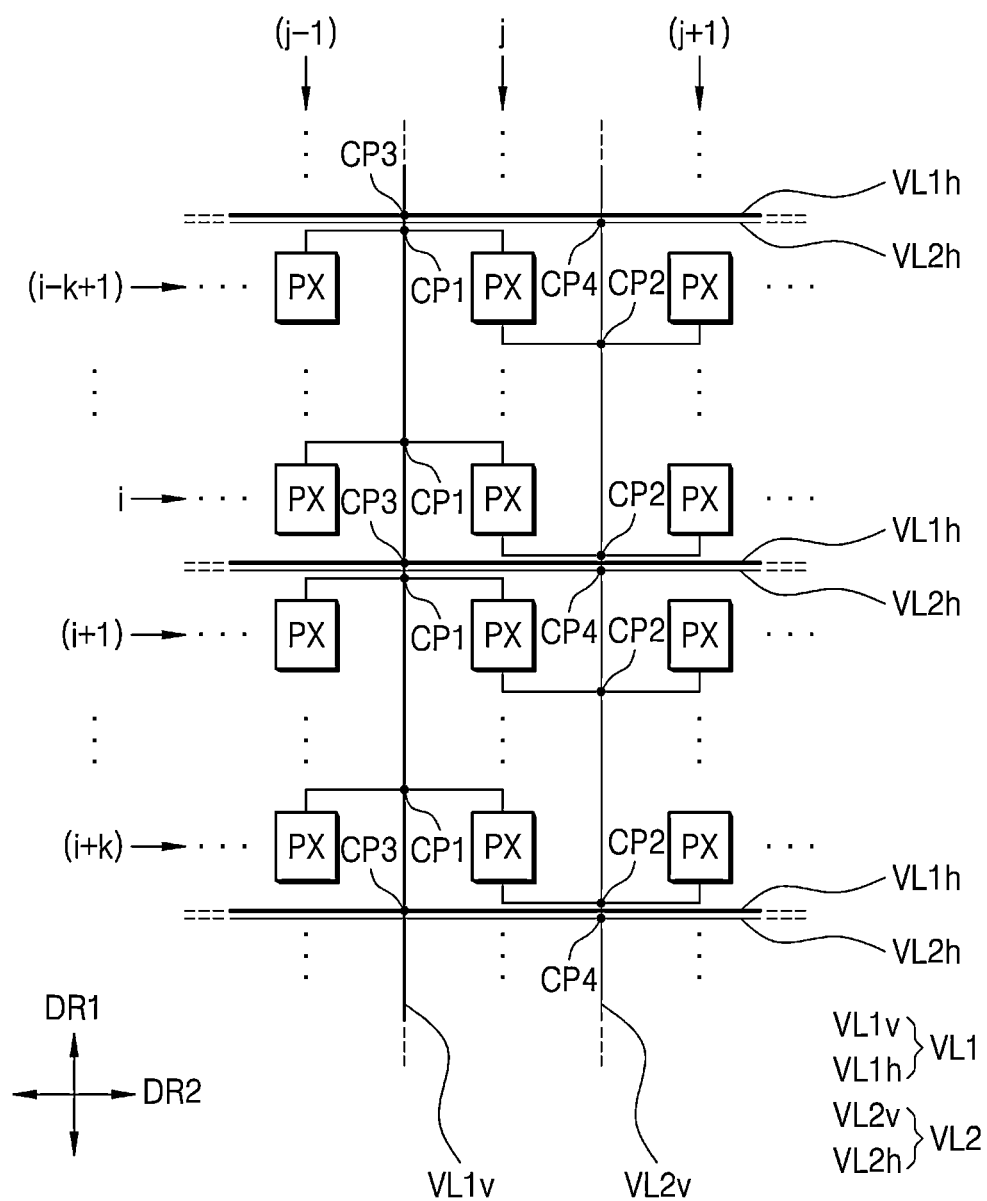
FIG. 13 shows another embodiment of a voltage line.

FIG. 13 shows another embodiment of a voltage line. FIG. 13 is a modification of FIG. 12, differing in a first voltage line and a second voltage line. In FIG. 13, descriptions overlapping with the description of FIG. 12 will be omitted, and differences will be mainly described below.

Referring to FIG. 13, all of the first horizontal line VL1h and the second horizontal line VL2h may be arranged between the pixels PX adjacent to each other in the first direction DR1.

In an embodiment, the number of pixels in the $j^{th}$ column arranged between the first horizontal line VL1h and the second horizontal line VL2h that are adjacent to each other among the plurality of first horizontal lines VL1h and the plurality of second horizontal lines VL2h may be k. In an embodiment, as shown in FIG. 13, pixels arranged in the $(i-k+1)^{th}$ row to the $i^{th}$ row may be arranged between the first horizontal line VL1h and the second horizontal line VL2h adjacent to each other in the first direction DR1, for example. In some embodiments, pixels arranged in the $(i+1)^{th}$ row to the $(i+k)^{th}$ row may be arranged between the first horizontal line VL1h and the second horizontal line VL2h adjacent to each other in the first direction DR1.

In other words, the number of pixels in the $j^{th}$ column arranged between the first horizontal lines VL1h adjacent to each other in the first direction DR1 among the plurality of first horizontal lines VL1h may be k. In an embodiment, as shown in FIG. 13, pixels arranged in an $(i-k+1)^{th}$ row to the $i^{th}$ row may be arranged between the first horizontal lines VL1h adjacent to each other in the first direction DR1, for example. In some embodiments, pixels arranged in the $(i+1)^{th}$ row to an $(i+k)^{th}$ row may be arranged between the first horizontal lines VL1h adjacent to each other in the first direction DR1.

In addition, the number of pixels in the $j^{th}$ column arranged between the second horizontal lines VL2h adjacent to each other in the first direction DR1 among the plurality of second horizontal lines VL2h may be k. In an embodiment, as shown in FIG. 13, pixels arranged in an $(i-k+1)^{th}$ row to the $i^{th}$ row may be arranged between the second horizontal lines VL2h adjacent to each other in the first direction DR1, for example. In some embodiments, pixels arranged in the $(i+1)^{th}$ row to an $(i+k)^{th}$ row may be arranged between the second horizontal lines VL2h adjacent to each other in the first direction DR1.

In an embodiment, the first horizontal lines VL1h and the second horizontal lines VL2h may be alternately arranged with each other in the first direction DR1. In other words, the third contact plugs CP3 and the fourth contact plugs CP4 may be alternately arranged with each other in the first direction DR1.

As discussed through FIGS. 6 to 13, all of the first horizontal lines VL1h and the second horizontal lines VL2h may be omitted, part of the first horizontal lines VL1h and the second horizontal lines VL2h may be omitted, or all of the first horizontal lines VL1h and the second horizontal lines VL2h may be arranged, and various modifications may be made. As the arrangement of the first horizontal lines VL1h and the second horizontal lines VL2h is adjusted, an area in which the pixels PX may be arranged may increase. Thus, a high-resolution may be implemented by adjusting the arrangement of the first horizontal lines VL1h and the second horizontal lines VL2h.

Although the display apparatus has been mainly described, the invention is not limited thereto. It may be understood that methods of manufacturing the display apparatus also fall within the scope of the invention, for example.

According to the various embodiments of the invention, a semiconductor pattern continuously extending in one direction may be unitarily provided as a single body, thereby improving a pixel defect problem such as a damage to the semiconductor pattern due to external static electricity. Thus, a defect in the display apparatus may be prevented.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
   first to third pixels sequentially arranged in a first direction;
   a first voltage line which transfers a first initialization voltage;
   a second voltage line which transfers a second initialization voltage;
   a first contact plug connecting the first pixel and the second pixel to the first voltage line;
   a second contact plug connecting the second pixel and the third pixel to the second voltage line;
   a plurality of pixels comprising the first to third pixels, and arranged in the first direction and a second direction perpendicular to the first direction;
   a plurality of first contact plugs connecting a pixel in an $i^{th}$ row and a $(2j-1)^{th}$ column and a pixel in the $i^{th}$ row and a $(2j)^{th}$ column among the plurality of pixels to the first voltage line, the plurality of first contact plugs including the first contact plug, where i and j are natural numbers; and
   a plurality of second contact plugs connecting the pixel in the $i^{th}$ row and the $(2j)^{th}$ column and a pixel in the $i^{th}$ row and a $(2j+1)^{th}$ column among the plurality of pixels, to the second voltage line, the plurality of second contact plugs including the second contact plug.

2. The display apparatus of claim 1, wherein the plurality of first contact plugs and the plurality of second contact plugs are alternately arranged in the first direction.

3. The display apparatus of claim 2, wherein the plurality of first contact plugs and the plurality of second contact plugs are arranged in the second direction.

4. The display apparatus of claim 1, wherein the first voltage line comprises a plurality of first perpendicular lines each extending in the second direction, and
   the second voltage line comprises a plurality of second perpendicular lines each extending in the second direction.

5. The display apparatus of claim 4, wherein the plurality of first perpendicular lines and the plurality of second perpendicular lines are alternately arranged in the first direction.

6. The display apparatus of claim 4, wherein each of the plurality of first perpendicular lines is unitarily provided as a single body with the plurality of first contact plugs, and
   each of the plurality of second perpendicular lines is unitarily provided as a single body with the plurality of second contact plugs.

7. The display apparatus of claim 4, wherein the first voltage line further comprises a plurality of first parallel lines each extending in the first direction.

8. The display apparatus of claim 7, wherein a number of pixels in a $j^{th}$ column among the plurality of pixels arranged between first parallel lines adjacent to each other in the second direction among the plurality of first parallel lines is k where k is a natural number.

9. The display apparatus of claim 8, wherein a number of pixels in the $i^{th}$ row among the plurality of pixels arranged between first perpendicular lines adjacent to each other in the first direction among the plurality of first perpendicular lines is 2.

10. The display apparatus of claim 7, wherein the plurality of first parallel lines are respectively connected to the plurality of first perpendicular lines through a plurality of third contact plugs.

11. The display apparatus of claim 7, wherein the second voltage line further comprises a plurality of second parallel lines each extending in the first direction.

12. The display apparatus of claim 11, wherein the plurality of first parallel lines and the plurality of second parallel lines are alternately arranged with each other in the second direction.

13. The display apparatus of claim 11, wherein a number of pixels in a $j^{th}$ column among the plurality of pixels arranged between a first parallel line and a second parallel line adjacent to each other in the second direction among the plurality of first parallel lines and the plurality of second parallel lines is k where k is a natural number, and
   a number of pixels in the $j^{th}$ column arranged between first parallel lines adjacent to each other in the second direction among the plurality of first parallel lines is greater than k.

14. The display apparatus of claim 11, wherein a number of pixels in a $j^{th}$ column among the plurality of pixels arranged between first parallel lines adjacent to each other in the second direction among the plurality of first parallel lines is k where k is a natural number, and a number of pixels in the $j^{th}$ column among the plurality of pixels arranged between second parallel lines adjacent to each other in the second direction among the plurality of second parallel lines is k.

15. The display apparatus of claim 11, wherein the plurality of second parallel lines are respectively connected to the plurality of second perpendicular lines through a plurality of fourth contact plugs.

16. A display apparatus comprising:
   first to third pixels sequentially arranged in a first direction;
      a first voltage line which transfers a first initialization voltage;
      a second voltage line which transfers a second initialization voltage;
      a first contact plug connecting the first pixel and the second pixel to the first voltage line; and
      a second contact plug connecting the second pixel and the third pixel to the second voltage line,
   wherein each of the first to third pixels comprises:
      a light-emitting element;
      a driving transistor which controls a current flowing to the light-emitting element according to a gate-source voltage;
      a first initialization transistor which applies one of the first initialization voltage and the second initialization voltage to an electrode of the driving transistor in response to a first scan signal; and
      a second initialization transistor which applies a remaining one of the first initialization voltage and the second initialization voltage to an electrode of the light-emitting element in response to a second scan signal.

17. The display apparatus of claim 16, wherein each of the first to third pixels further comprises:
   a scan transistor which transfers a data voltage to the driving transistor in response to a third scan signal; and
   a storage capacitor having a first electrode and a second electrode, the second electrode being connected to a gate of the driving transistor.

18. The display apparatus of claim 17, wherein each of the first to third pixels further comprises a compensation transistor connecting a drain of the driving transistor and the gate of the driving transistor to each other in response to the third scan signal.

19. The display apparatus of claim 18, wherein each of the first to third pixels further comprises:
   a first emission control transistor which transfers a driving voltage to the driving transistor in response to an emission control signal; and
   a second emission control transistor which connects the driving transistor and the light-emitting element to each other in response to the emission control signal.

20. A display apparatus comprising:
   a plurality of pixels arranged in a first direction; and
      a semiconductor pattern unitarily provided as a single body, and continuously extending in the first direction,
      wherein pixels in a $(2j-1)^{th}$ column and pixels in a $(2j)^{th}$ column among the plurality of pixels share a plurality of first contact plugs which transfer a first initialization voltage where j is a natural number,
      the pixels in the $(2j)^{th}$ column and pixels in a $(2j+1)^{th}$ column among the plurality of pixels share a plurality of second contact plugs which transfer a second initialization voltage, and
      the semiconductor pattern comprises a plurality of pixel areas respectively included in the plurality of pixels, a plurality of first contact areas respectively corresponding to the plurality of first contact plugs, and a plurality of second contact areas respectively corresponding to the plurality of second contact plugs.

21. The display apparatus of claim 20, wherein each of the plurality of first contact areas connects a $(2j-1)^{th}$ column pixel area and a $(2j)^{th}$ column pixel area among the plurality of pixel areas, and
   each of the plurality of second contact areas connects the $(2j)^{th}$ column pixel area and a $(2j+1)^{th}$ column pixel area among the plurality of pixel areas.

22. The display apparatus of claim 20, wherein the plurality of first contact areas and the plurality of second contact areas are alternately arranged in the first direction.

23. The display apparatus of claim 20, further comprising:
   a first voltage line which is connected to the plurality of first contact plugs and receives the first initialization voltage; and
   a second voltage line which is connected to the plurality of second contact plugs and receives the second initialization voltage.

24. The display apparatus of claim 23, wherein the first voltage line comprises a plurality of first perpendicular lines each extending in a second direction perpendicular to the first direction, and
   the second voltage line comprises a plurality of second perpendicular lines each extending in the second direction.

25. The display apparatus of claim 24, wherein the plurality of first perpendicular lines and the plurality of second perpendicular lines are alternately arranged in the first direction.

26. The display apparatus of claim 24, wherein the first voltage line further comprises a plurality of first parallel lines each extending in the first direction.

27. The display apparatus of claim 26, wherein a number of pixels in a $j^{th}$ column among the plurality of pixels arranged between first parallel lines adjacent to each other in the second direction among the plurality of first parallel lines is k where k is a natural number.

28. The display apparatus of claim 20, wherein each of the plurality of pixels comprises:
   a light-emitting element;
   a driving transistor which controls a current flowing to the light-emitting element according to a gate-source voltage;
   a first initialization transistor which applies one of the first initialization voltage and the second initialization voltage to an electrode of the driving transistor in response to a first scan signal; and
   a second initialization transistor which applies a remaining one of the first initialization voltage and the second initialization voltage to an electrode of the light-emitting element in response to a second scan signal.

29. The display apparatus of claim 28, wherein each of the plurality of pixels further comprises:
   a scan transistor which transfers a data voltage to the driving transistor in response to a third scan signal; and
   a storage capacitor having a first electrode and a second electrode, the second electrode being connected to a gate of the driving transistor.

* * * * *